United States Patent
Lee et al.

(10) Patent No.: US 10,566,252 B2
(45) Date of Patent: Feb. 18, 2020

(54) OVERLAY-CORRECTION METHOD AND A CONTROL SYSTEM USING THE SAME

(71) Applicant: SAMSUNG ELECTRONICS CO., LTD., Suwon-si, Gyeonggi-Do (KR)

(72) Inventors: Seungyoon Lee, Seoul (KR); Chan Hwang, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 116 days.

(21) Appl. No.: 15/860,801

(22) Filed: Jan. 3, 2018

(65) Prior Publication Data
US 2018/0330999 A1  Nov. 15, 2018

(30) Foreign Application Priority Data
May 15, 2017 (KR) .................. 10-2017-0060157

(51) Int. Cl.
| | | |
|---|---|---|
| *H01L 21/66* | (2006.01) | |
| *G03F 9/00* | (2006.01) | |
| *G03F 7/20* | (2006.01) | |
| *G03F 1/00* | (2012.01) | |

(52) U.S. Cl.
CPC .............. *H01L 22/12* (2013.01); *G03F 1/144* (2013.01); *G03F 7/70633* (2013.01); *G03F 9/7019* (2013.01); *G03F 7/705* (2013.01); *G03F 7/70525* (2013.01)

(58) Field of Classification Search
CPC ....... H01L 22/12; G03F 1/144; G03F 9/7019; G03F 7/705
See application file for complete search history.

(56) References Cited

U.S. PATENT DOCUMENTS

| | | | |
|---|---|---|---|
| 7,333,173 B2 | 2/2008 | Chiang et al. | |
| 7,426,011 B2 | 9/2008 | Zaal et al. | |
| 8,655,469 B2 | 2/2014 | Choi et al. | |
| 9,189,705 B2 * | 11/2015 | Jeong | G06T 7/001 |
| 9,310,698 B2 | 4/2016 | Menchtchikov et al. | |
| 9,442,392 B2 | 9/2016 | Tsen et al. | |
| 9,679,821 B2 | 6/2017 | Jung et al. | |
| 9,817,392 B2 * | 11/2017 | Chung | G03B 27/52 |

(Continued)

FOREIGN PATENT DOCUMENTS

KR  2003-0084030  11/2003

*Primary Examiner* — Vincent H Tran
(74) *Attorney, Agent, or Firm* — F. Chau & Associates, LLC

(57) ABSTRACT

A method of correcting an overlay includes: forming a first pattern on a first substrate; forming a second pattern on the first pattern; obtaining a first overlay error profile of the second pattern and obtaining a first overlay correction profile from the first overlay error profile; forming a third pattern on the second pattern; obtaining a second overlay error profile of the third pattern and obtaining a second overlay correction profile from the second overlay error profile; and forming the second pattern on a second substrate, wherein the forming of the second pattern on the second substrate includes: determining whether the second overlay correction profile has a non-correctable model parameter; and when the second overlay correction profile has the non-correctable model, obtaining a preliminary correction profile to correct a position of the second pattern to be formed on the second substrate.

20 Claims, 25 Drawing Sheets

(56) References Cited

U.S. PATENT DOCUMENTS

| | | | |
|---|---|---|---|
| 2003/0074639 A1* | 4/2003 | Park | G03F 7/70633 430/22 |
| 2008/0057418 A1* | 3/2008 | Seltmann | G03F 7/70633 430/30 |
| 2008/0077894 A1* | 3/2008 | Adel | G03F 7/70533 716/52 |
| 2009/0040536 A1* | 2/2009 | Chiu | G03B 27/42 356/620 |
| 2012/0244461 A1* | 9/2012 | Nagai | G03F 7/70633 430/30 |
| 2013/0054186 A1* | 2/2013 | Den Boef | H01L 23/544 702/150 |
| 2013/0060354 A1 | 3/2013 | Choi et al. | |
| 2015/0043803 A1* | 2/2015 | Jeong | G06T 7/001 382/149 |
| 2016/0047744 A1* | 2/2016 | Adel | G03F 7/70633 356/401 |
| 2016/0161864 A1 | 6/2016 | Middlebrooks et al. | |
| 2016/0357115 A1* | 12/2016 | Kok | G03F 7/70258 |
| 2017/0017162 A1 | 1/2017 | Chang et al. | |
| 2018/0173110 A1* | 6/2018 | Hu | G03F 7/705 |
| 2018/0275529 A1* | 9/2018 | Dai | H01L 22/20 |
| 2018/0322237 A1* | 11/2018 | Ten Berge | G03F 1/70 |

\* cited by examiner

OVERLAY-CORRECTION METHOD AND A CONTROL SYSTEM USING THE SAME

CROSS-REFERENCE TO RELATED APPLICATION

This U.S. non-provisional patent application claims priority under 35 U.S.C. § 119 to Korean Patent Application No. 10-2017-0060157, filed on May 15, 2017, in the Korean Intellectual Property Office, the disclosure of which is incorporated by reference herein in its entirety.

TECHNICAL FIELD

The present inventive concept relates to a method and system for fabricating a semiconductor device, and in particular, to a method of correcting an overlay error of a fine pattern and a control system using the method.

DISCUSSION OF RELATED ART

In general, a semiconductor device is fabricated by a plurality of unit processes and a plurality of inspection processes. The unit processes may be performed to form a fine pattern on a substrate. The unit processes may include, for example, a deposition process, a diffusion process, a thermal treatment process, a photolithography process, a polishing process, an etching process, an ion implantation process, or a cleaning process. In particular, the photolithography process is used to form a mask pattern on the substrate. The fine pattern is formed by etching the substrate or an underlying layer exposed by the mask pattern.

The inspection processes may be performed to measure the fine pattern, and then, to determine whether or not the unit processes were performed normally. An inspection processes may, however, be performed each time a unit process is finished. In addition, the inspection processes may obtain information regarding a fine distortion of the pattern. This information is used to form a fine pattern in another substrate so that there may not be a misalignment in a subsequent unit process. In other words, the inspection processes include measuring an overlay error.

SUMMARY

According to an exemplary embodiment of the inventive concept, a method of correcting an overlay may include forming a first pattern on a first substrate using a first fabrication system, forming a second pattern on the first pattern using the first fabrication system, obtaining a first overlay error profile of the second pattern with respect to the first pattern and obtaining a first overlay correction profile from the first overlay error profile, forming a third pattern on the second pattern using a second fabrication system, obtaining a second overlay error profile of the third pattern with respect to the second pattern and obtaining a second overlay correction profile from the second overlay error profile, and forming the second pattern on a second substrate using the first fabrication system. The forming of the second pattern on the second substrate may include determining whether the second overlay correction profile has a non-correctable model parameter that cannot be used to correct a control parameter of the second fabrication system, and when the second overlay correction profile has the non-correctable model parameter, obtaining a preliminary correction profile for the first fabrication system, to correct a position of the second pattern before the second pattern is formed on the second substrate.

According to an exemplary embodiment of the inventive concept, a method of correcting an overlay may include forming a first pattern on a first substrate using a first fabrication system, forming a second pattern on the first pattern using a second fabrication system, obtaining an overlay error profile of the second pattern with respect to the first pattern and obtaining an overlay correction profile from the overlay error profile, and forming the first pattern on a second substrate using the first fabrication system. The forming of the first pattern on the second substrate may include determining whether the overlay correction profile has a non-correctable model parameter that cannot be used to correct a control parameter of the second fabrication system, and when the overlay correction profile has the non-correctable model parameter, obtaining a preliminary correction profile for the first fabrication system to correct a position of the first pattern before the first pattern is formed on the second substrate.

According to an exemplary embodiment of the inventive concept, a control system may include a processor and a memory, which is configured to store a program code to be executed by the processor. The program code may be configured to perform steps of obtaining an overlay error profile from an overlay error of first and second patterns on a first substrate, obtaining an overlay correction profile, in which a model parameter of the overlay error is included, by using the overlay error, determining whether the overlay correction profile has a non-correctable model parameter that cannot be used to correct a control parameter of a second fabrication system for a subsequent step, and when the overlay correction profile has the non-correctable model parameter, obtaining a preliminary correction profile, which can be used to cancel the non-correctable model parameter, to correct a position of the first pattern on a second substrate, in a first fabrication system for a previous step.

BRIEF DESCRIPTION OF THE DRAWINGS

Like reference numerals may refer to like elements in the drawings.

DETAILED DESCRIPTION OF THE EMBODIMENTS

Figure 1:
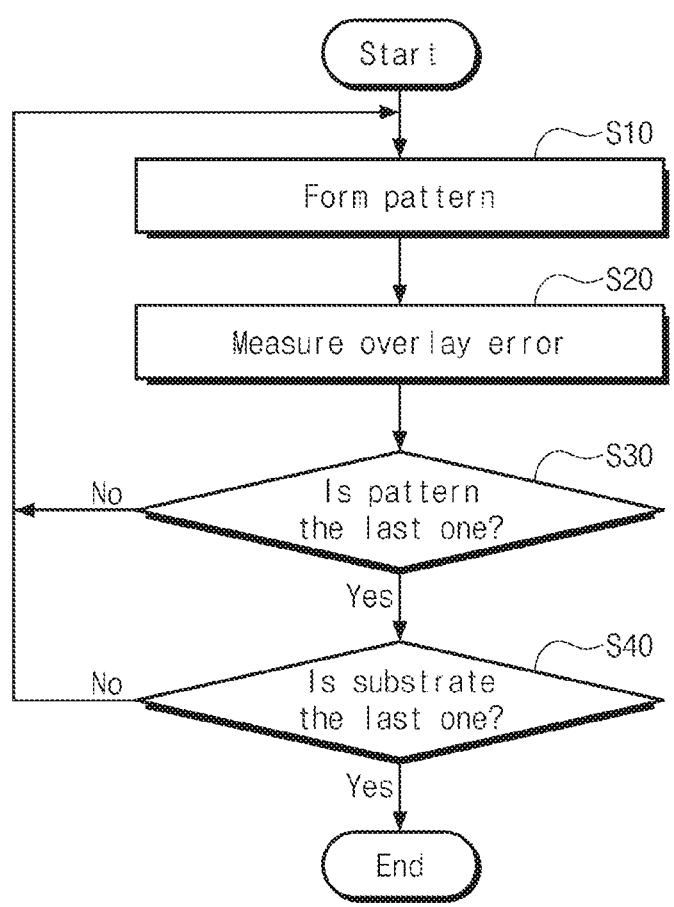
FIG. 1 is a flow chart illustrating a method of fabricating a semiconductor device, according to an exemplary embodiment of the inventive concept.

FIG. 1 is a flow chart illustrating a method of fabricating a semiconductor device, according to an exemplary embodiment of the inventive concept.

Referring to FIG. 1, a method of fabricating a semiconductor device may include forming a pattern (in S10), measuring an overlay error (in S20), examining (e.g., determining) whether the pattern is the last one (in S30), and examining (e.g., determining) whether the substrate is the last one (in S40). The pattern may be formed by using a fabrication system. The measurement of the overlay error may be performed using an inspection system. The formation of the pattern (in S10) and the measurement of the overlay error (in S20) may be repeated until the pattern under test is the last one (in S30). In addition, the formation of the pattern (in S10) and the measurement of the overlay error (in S20) may be repeated on each of a plurality of substrates, until the substrate under test is the last one (in S40). Each of the substrates may be or include a silicon wafer, but the inventive concept is not limited thereto. The substrates may be loaded in a carrier. The measurement of the overlay error (in S20) may be described with reference to one of the substrates in the carrier.

Figure 2:
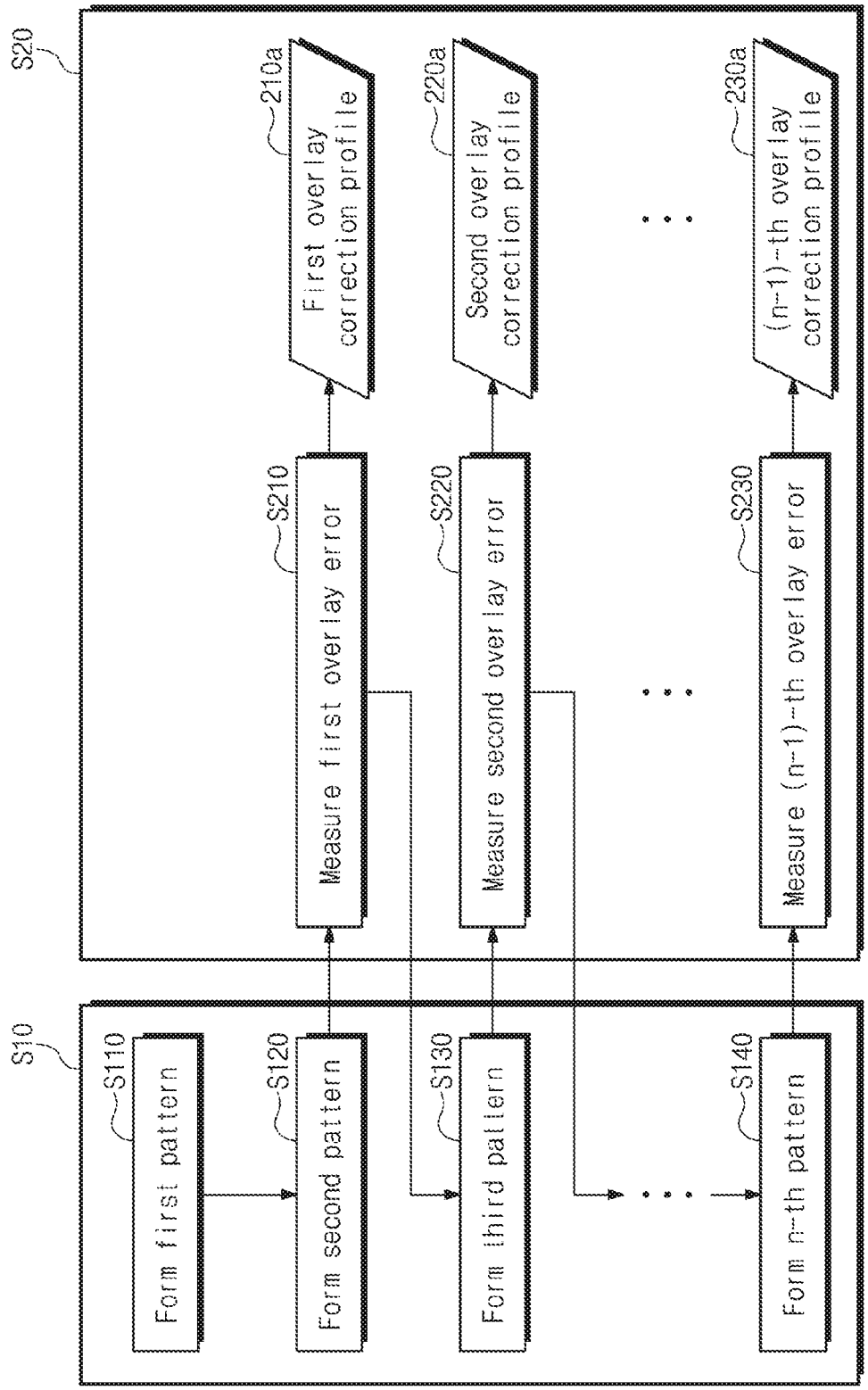
FIG. 2 is a flow chart illustrating steps of forming a pattern and measuring an overlay error, shown in FIG. 1, according to an exemplary embodiment of the inventive concept.
Figure 3:
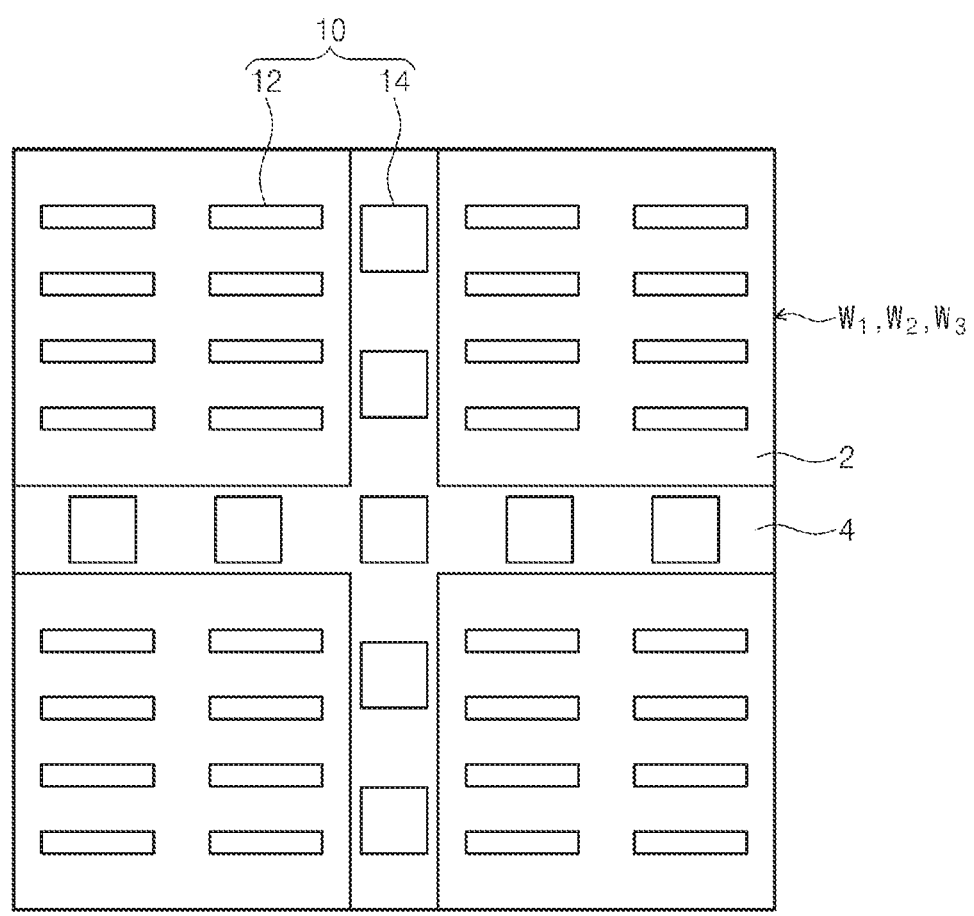
FIG. 3 is a plan view illustrating a step of forming a first pattern, shown in FIG. 2, according to an exemplary embodiment of the inventive concept.
Figure 4:
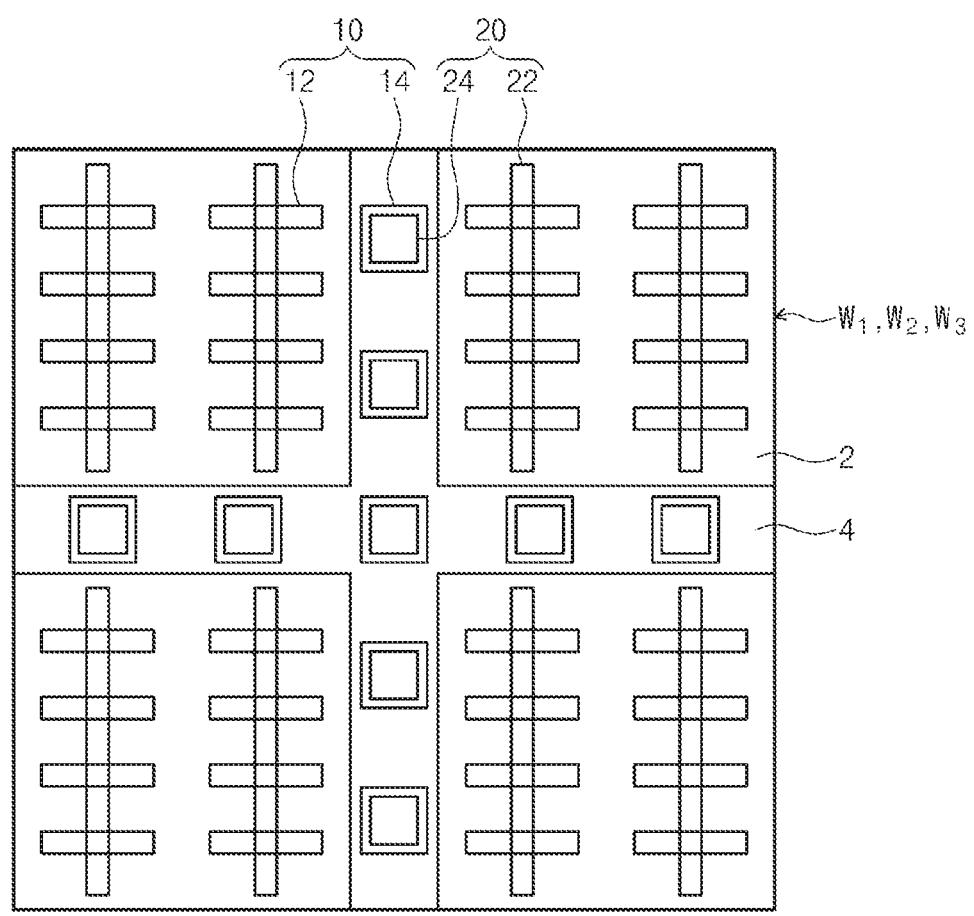
FIG. 4 is a plan view illustrating a step of forming a second pattern, shown in FIG. 2, according to an exemplary embodiment of the inventive concept.
Figure 5:
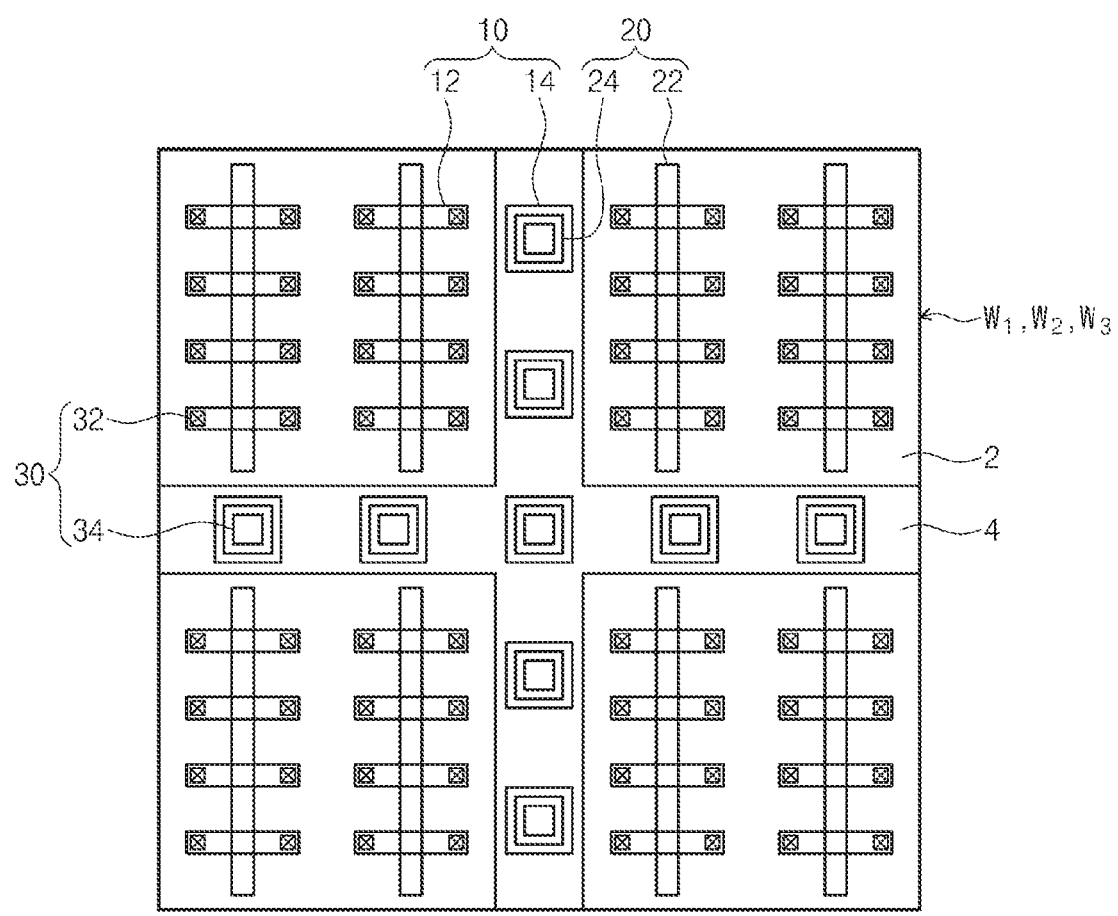
FIG. 5 is a plan view illustrating a step of forming a third pattern, shown in FIG. 2, according to an exemplary embodiment of the inventive concept.

FIG. 2 is a flow chart illustrating the steps S10 and S20 (i.e., forming a pattern and measuring an overlay error) of FIG. 1, according to an exemplary embodiment of the inventive concept. FIG. 3 is a plan view illustrating step S110 (i.e., forming a first pattern 10) of FIG. 2, according to an exemplary embodiment of the inventive concept. FIG. 4 is a plan view illustrating step S120 (i.e., forming a second pattern 20) of FIG. 2, according to an exemplary embodiment of the inventive concept. FIG. 5 is a plan view illustrating step S130 (i.e., forming a third pattern 30) of FIG. 2, according to an exemplary embodiment of the inventive concept.

Referring to FIGS. 2 to 5, the formation of the pattern (in S10) may include forming a first pattern 10 (in S110), forming a second pattern 20 (in S120), forming a third pattern 30 (in S130), and forming an n-th pattern (in S140).

The measurement of the overlay error (in S20) may include measuring a first overlay error (in S210), measuring a second overlay error (in S220), and measuring an (n−1)-th overlay error (in S230). After each measurement of the overlay error, each overlay error may be calculated and may be stored as first to (n−1)-th overlay correction profiles. For example, the measurement of the first overlay error (in S210) may produce a first overlay correction profile 210a, the measurement of the second overlay error (in S220) may produce a second overlay correction profile 220a and the measurement of the (n−1)-th overlay error (in S230) may produce an (n−1)-th overlay correction profile 230a.

Figure 6:
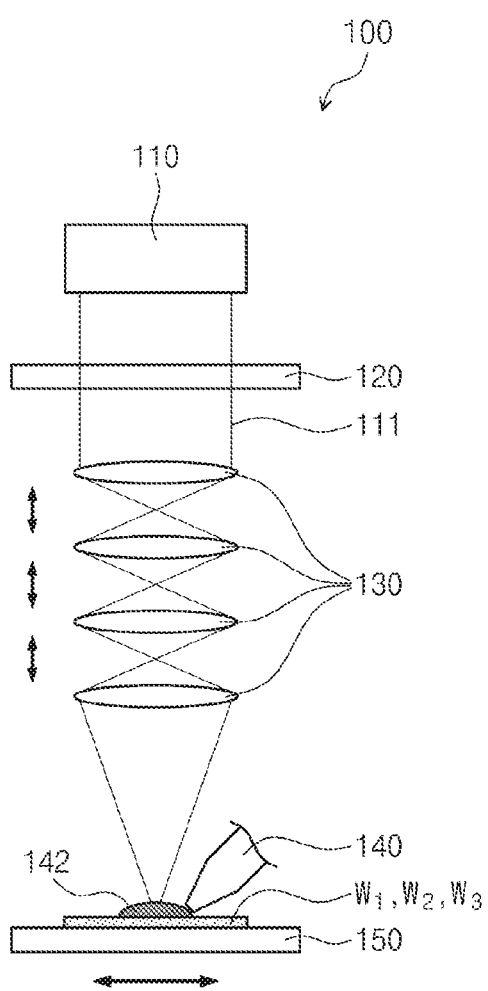
FIG. 6 is a schematic diagram illustrating a first fabrication system that can be used to form the first and second patterns of FIGS. 3 and 4, according to an exemplary embodiment of the inventive concept.

FIG. 6 is a schematic diagram illustrating a first fabrication system 100 that can be used to form the first and second patterns 10 and 20, according to an exemplary embodiment of the inventive concept.

Referring to FIGS. 2, 3, and 6, a first fabrication system 100 may be used to form the first pattern 10 on a first substrate W1 (in S110). The first pattern 10 may be formed at a preset position on the first substrate W1.

The first fabrication system 100 may be configured to perform a unit process. For example, the first fabrication system 100 may include an argon fluoride (ArF) immersion exposure system, but the inventive concept is not limited thereto. The first fabrication system 100 may include an exposure system, in which an $F_2$ laser (157 nm), an ArF laser (193 nm), a KrF laser (248 nm), or an i-line (365 nm) is used as a light source. In an exemplary embodiment of the inventive concept, the first fabrication system 100 may include a first light source 110, a first reticle 120, transparent lenses 130, a liquid supplying unit 140, and a first stage 150. The first light source 110 may be used to provide a first light 111 onto the first reticle 120. The first light 111 passing through the first reticle 120 may be used to project an image of the first pattern 10 onto the transparent lenses 130. The transparent lenses 130 may be used to provide the first light 111 to the first substrate W1. The number of the transparent lenses 130 provided between the first reticle 120 and the first stage 150 may be about 20. Parameters for controlling the first light 111 and/or the first fabrication system 100 may be determined based on a distance between the transparent lenses 130. The liquid supplying unit 140 may be used to supply a liquid 142 (e.g., water) onto the first substrate W1. The liquid 142 may have a refractive index higher than that of the air. The wavelength of the first light 111 may become shorter in the liquid 142. The first stage 150 may be used to move the first substrate W1. The image of the first pattern 10 may be copied onto the first substrate W1. In other words, the image of the first pattern 10 may be formed on the first substrate W1. The first pattern 10 may have a critical dimension that is smaller than the wavelength of the first light 111 outside the liquid 142.

The first substrate W1 may include chip regions 2 and a scribe region 4. The chip regions 2 may be defined by the scribe region 4. The scribe region 4 may be a boundary region interposed between the chip regions 2. There may be about 100-2,000 chip regions in the first substrate W1. However, the inventive concept is not limited thereto.

The first pattern 10 may be formed in the chip regions 2 and the scribe region 4. In an exemplary embodiment of the inventive concept, the first pattern 10 may include an active pattern 12 and a first overlay pattern 14. The active pattern 12 may be formed in each of the chip regions 2. The active pattern 12 may have, for example, a rectangular shape. In an exemplary embodiment of the inventive concept, a plurality of the active patterns 12 may be arranged in an x and/or y direction, but the inventive concept is not limited thereto. The first overlay pattern 14 may be formed in the scribe region 4. The first overlay pattern 14 may be shaped like a square, for example.

Referring to FIGS. 2, 4, and 6, the second pattern 20 may be formed on the first pattern 10 using the first fabrication system 100 (in S120). The second pattern 20 may be formed at a preset position on the first substrate W1. The second pattern 20 may be formed on the active pattern 12 and the first overlay pattern 14. In an exemplary embodiment of the inventive concept, the second pattern 20 may include a gate pattern 22 and a second overlay pattern 24. The gate pattern 22 may be formed on the active pattern 12. The gate pattern 22 may extend across the active pattern 12 in each of the chip regions 2. The gate pattern 22 may extend in a y direction, but the inventive concept is not limited thereto. The second overlay pattern 24 may be formed in the first overlay pattern 14. For example, the second overlay pattern 24 may be shaped like a square.

Figure 7A:
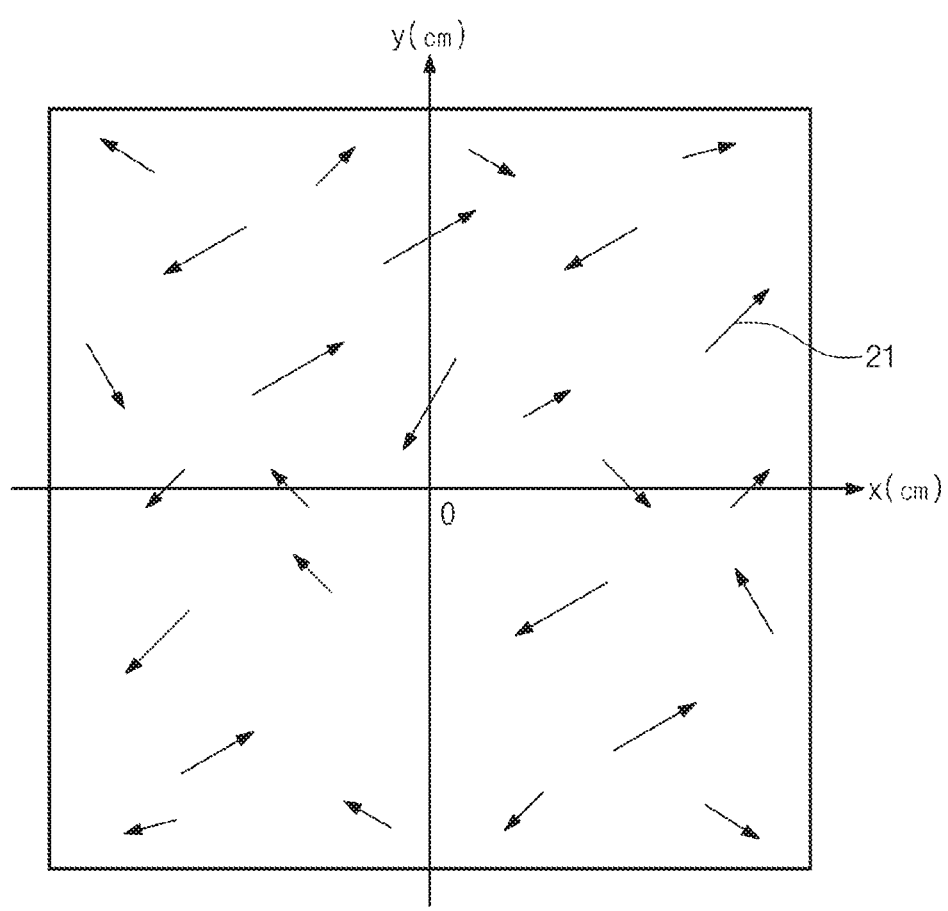
FIGS. 7A and 7B are diagrams illustrating a first overlay error of a second overlay pattern with respect to a first overlay pattern of FIG. 4, according to an exemplary embodiment of the inventive concept.
Figure 7B:
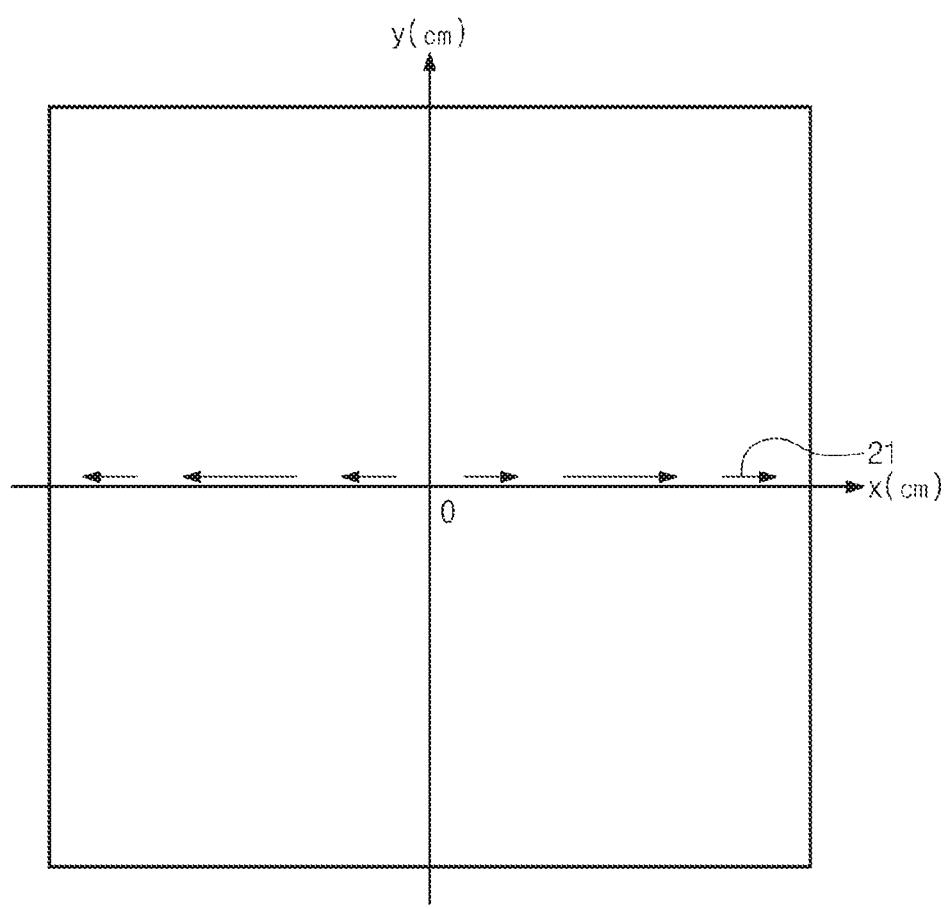

FIGS. 7A and 7B are diagrams illustrating a first overlay error 21 of the second overlay pattern 24 with respect to the first overlay pattern 14, according to an exemplary embodiment of the inventive concept.

Referring to FIGS. 2, 4, 7A, and 7B, an inspection system may be used to measure a first overlay error 21 (in S210). The inspection system may be an electron microscope or an optical microscope. As shown in FIG. 7A, displacement of the first overlay error 21 may have non-vanishing components (see arrows) in both of x and y directions. However, for clarity, only the x component of the displacement will be illustrated in FIG. 7B.

The first overlay error 21 may be a displacement of the second overlay pattern 24 with respect to the first overlay pattern 14. When the first overlay error 21 is measured, the first overlay pattern 14 may be used as a parent pattern and the second overlay pattern 24 may be used as a child pattern. In other words, the first overlay pattern 14 may be a reference pattern. The first overlay error 21 may be represented as a vector quantity in a two-dimensional Cartesian coordinate system spanned by x- and y-axes. In an exemplary embodiment of the inventive concept, the first overlay error 21 may be represented in a polar coordinate system.

Figure 8:
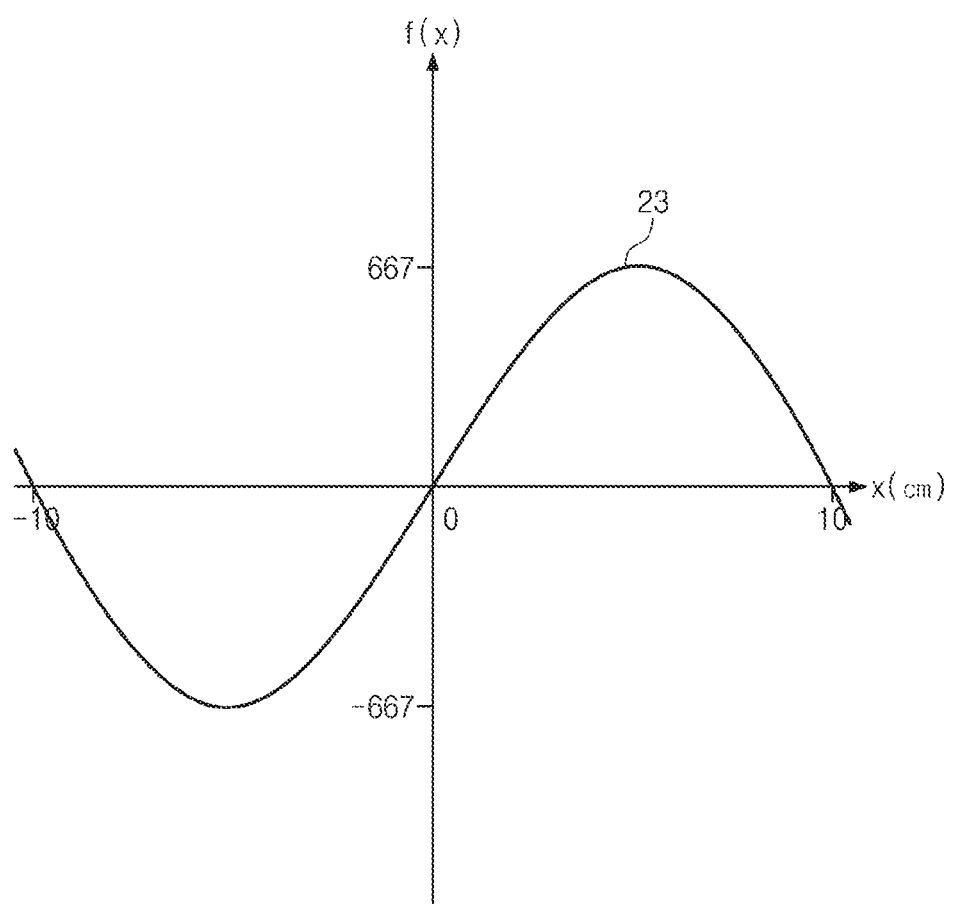
FIG. 8 is a graph illustrating a first overlay error profile obtained from the first overlay error of FIG. 7B, according to an exemplary embodiment of the inventive concept.

FIG. 8 illustrates a first overlay error profile 23 calculated from the first overlay error 21 of FIG. 7B. Referring to FIG. 8, the inspection system may obtain the first overlay error profile 23 from the first overlay error 21. The first overlay error profile 23 may contain information on a calculated position of the second pattern 20 formed on the first substrate W1. The first overlay error 21 may be modeled by a regression analysis method. For example, the first overlay error profile 23 may be expressed by a polynomial $$\left(e.g., f(x, y) = \sum_{i=1}^{n} \sum_{j=1}^{n} \sum_{k=1}^{n} a_i x^j y^k\right).$$

As an example, the first overlay error profile 23 may be expressed as follows: $a_1+a_2x+a_3y+a_4x^2+a_5xy+a_6y^2+a_7x^3+a_8x^2y+a_9xy^2+a_{10}y^3+\ldots$. Here, the coefficients $a_1$, $a_2$, $a_3$, $a_4$, $a_5$, $a_6$, $a_7$, $a_8$, $a_9$, and $a_{10}$, which will be referred to as first to tenth model parameters, may be constant.

In reference to FIG. 8, if the second and seventh model parameters $a_2$ and $a_7$ are 100 and −1, respectively, the first overlay error profile 23 may be expressed by $-x^3+100x$. Here, all of the remaining model parameters (i.e., $a_1$, $a_3$, $a_4$, $a_5$, $a_6$, $a_8$, $a_9$, and $a_{10}$) may be zero.

Figure 9:
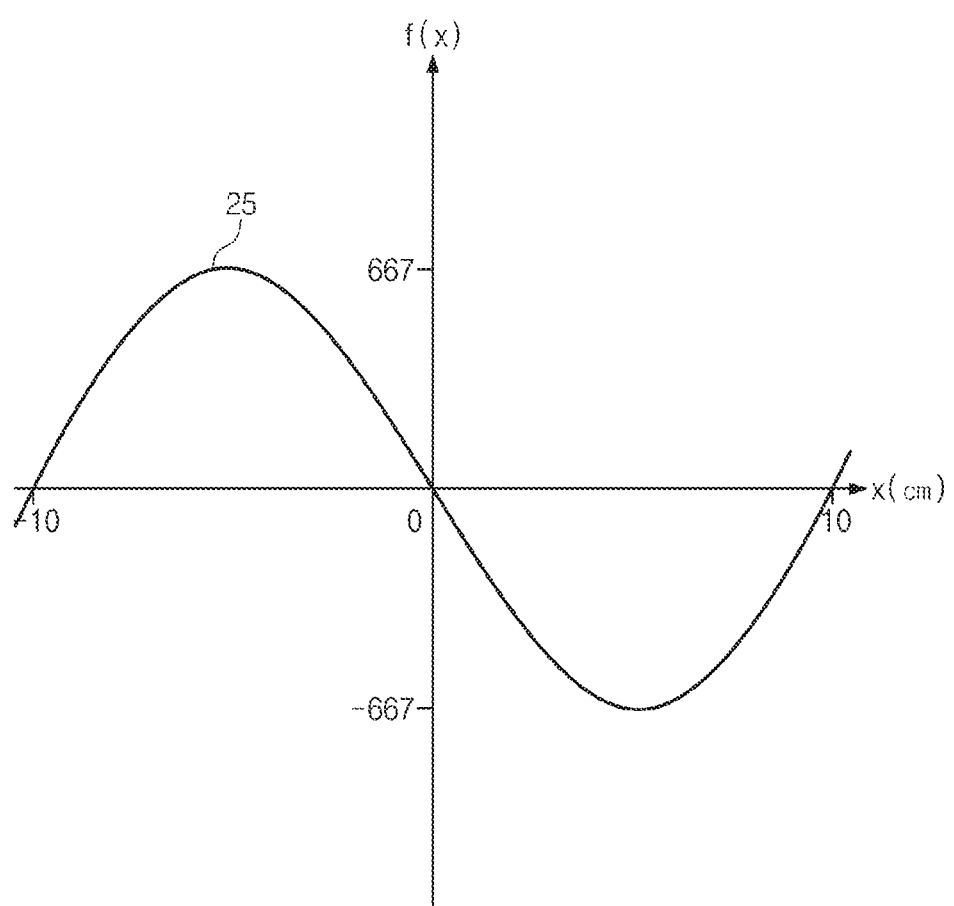
FIG. 9 is a graph illustrating a first overlay correction profile obtained from the first overlay error profile of FIG. 8, according to an exemplary embodiment of the inventive concept.

FIG. 9 illustrates a first overlay correction profile 25 obtained from the first overlay error profile 23. The first overlay correction profile 25 may contain information on a corrected position of the second pattern 20, which will be formed on a second substrate W2 in a subsequent process. The first overlay correction profile 25 may have an opposite sign to that of the first overlay error profile 23. In other words, the first overlay correction profile 25 may have an opposite phase to that of the first overlay error profile 23. For example, when the first overlay correction profile 25 has a positive (+) mathematical sign, the first overlay error profile 23 has a negative (−) mathematical sign. For example, in the case where the first overlay error profile 23 is modeled by $-x^3+100x$, the first overlay correction profile 25 may be given by $x^3-100x$. In subsequent processes, the second pattern 20 may be formed on the second substrate W2, corrected according to the first overlay correction profile 25, using the first fabrication system 100. Thus, from the time when the first fabrication system 100 is used for the second substrate W2, it is possible to correct an overlay error of the first fabrication system 100.

Figure 10:
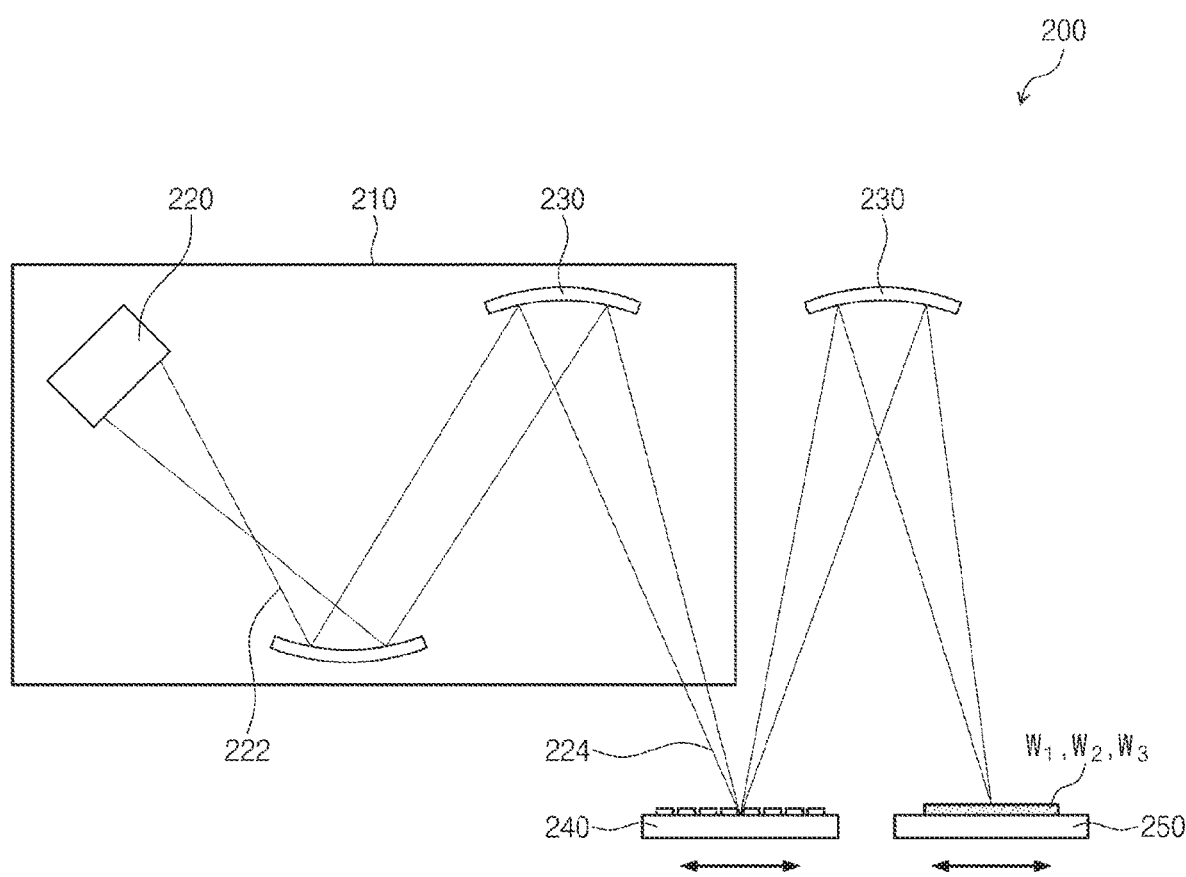
FIG. 10 is a schematic diagram illustrating a second fabrication system that can be used to form the third pattern of FIG. 5, according to an exemplary embodiment of the inventive concept.

FIG. 10 is a schematic diagram illustrating a second fabrication system 200 that can be used to form the third pattern 30, according to an exemplary embodiment of the inventive concept. Referring to FIGS. 2, 5, and 10, the second fabrication system 200 may be used to form the third pattern 30 on the first pattern 10 and the second pattern 20 (in S130). The third pattern 30 may be formed at a preset position on the first substrate W1.

Referring to FIG. 10, the second fabrication system 200 may perform a unit process. The second fabrication system 200 may differ from the first fabrication system 100. For example, the second fabrication system 200 may be or include an extreme ultraviolet lithography (EUV) exposure system. In an exemplary embodiment of the inventive concept, the second fabrication system 200 may include a chamber 210, a pump light source 220, mirror lenses 230, a second reticle 240, and a second stage 250. The chamber 210 may be filled with a process gas containing xenon (Xe), lithium (Li), tin (Sn), or titanium (Ti). The pump light source 220 may provide a pump light 222 to the process gas. The process gas may be excited by the pump light 222, and in this case, a second light 224 may be generated. The second light 224 may be an EUV light having a wavelength of about 13.5 nm. The mirror lenses 230 may be provided inside or outside the chamber 210. One of the mirror lenses 230 may reflect the second light 224 toward the second reticle 240, and the second reticle 240 may reflect the second light 224 toward another of the mirror lenses 230. For example, the second reticle 240 may reflect the second light 224 to a mirror lens 230 outside the chamber 210. The second reticle 240 may project an image of the third pattern 30 to the mirror lenses 230. One of the mirror lenses 230 may reflect and focus the second light 224 onto the first substrate W1. The second stage 250 may be used to move the first substrate W1. When the first substrate W1 is moved by the second stage 250, the second reticle 240 may be moved relative to the first substrate W1. The image of the third pattern 30 may be copied to the first substrate W1. In other words, the third pattern 20 may be formed on the first substrate W1.

Referring back to FIG. 5, the second fabrication system 200 may be used to form the third pattern 30 on the active pattern 12 of the second substrate W2 and on the second overlay pattern 24. In an exemplary embodiment of the inventive concept, the third pattern 30 may include a contact hole pattern 32 and a third overlay pattern 34. The contact hole pattern 32 may be formed on at least one side edge of the active pattern 12. For example, the contact hole pattern 32 may be formed at opposite sides of the active pattern 12. The contact hole pattern 32 may be spaced apart from the gate pattern 22. The third overlay pattern 34 may be formed in the second overlay pattern 24, when viewed in a plan view.

Figure 11A:
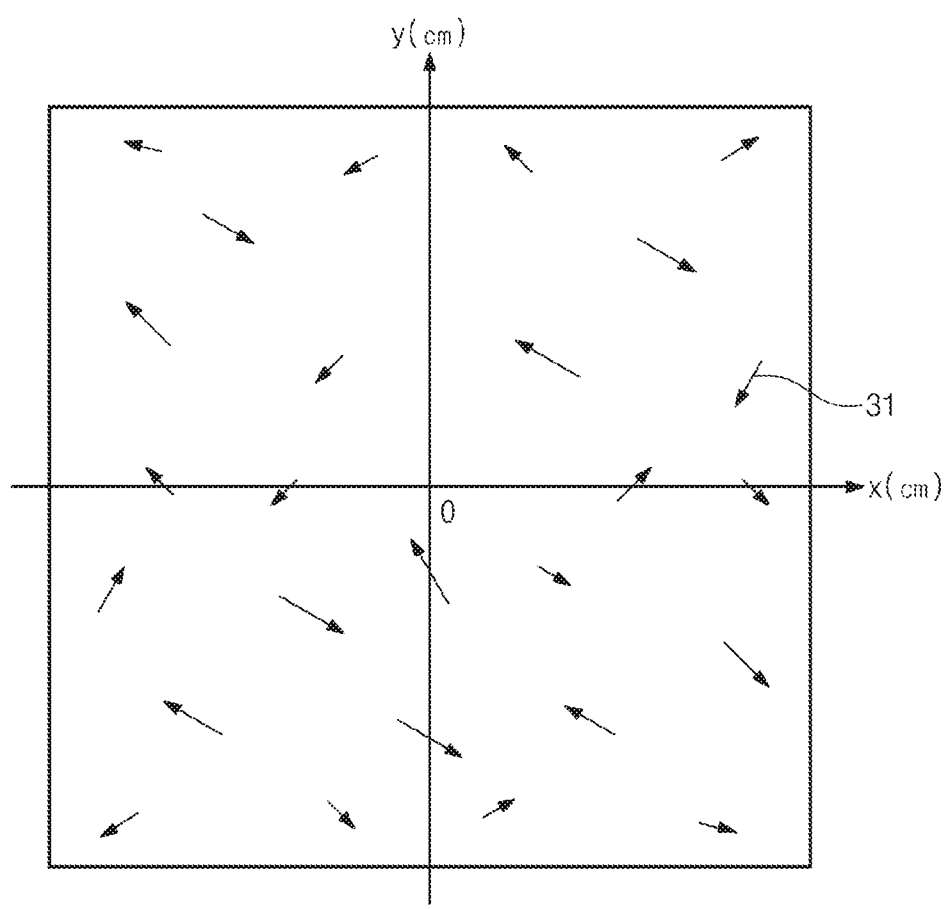
FIGS. 11A and 11B are diagrams illustrating a second overlay error of a third overlay pattern with respect to a second overlay pattern of FIG. 5, according to an exemplary embodiment of the inventive concept.
Figure 11B:
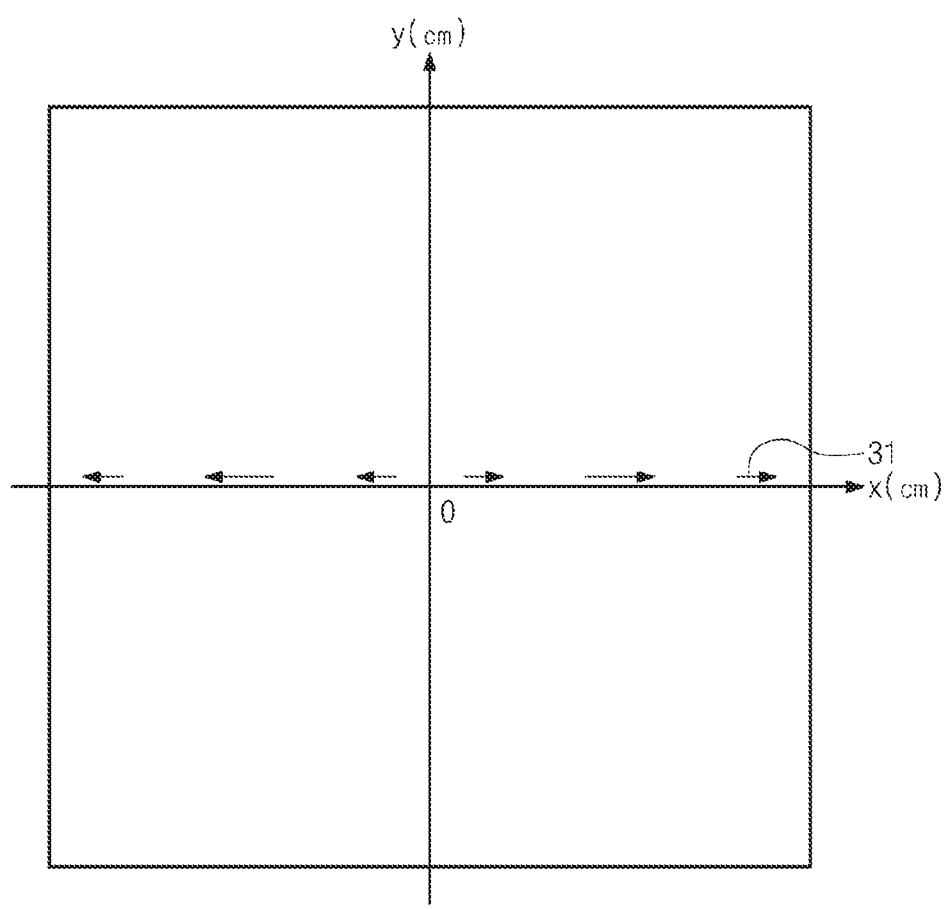

FIGS. 11A and 11B illustrate a second overlay error 31 of the third overlay pattern 34 with respect to the second overlay pattern 24, according to an exemplary embodiment of the inventive concept. As shown in FIG. 11A, displacement of the second overlay error 31 may have non-vanishing components (see arrows) in both of x and y directions. However, for clarity, only the x component of the displacement will be illustrated in FIG. 11B.

Referring to FIGS. 2, 5, and 11B, the inspection system may be used to measure the second overlay error 31 (in S220). The second overlay error 31 may be a displacement of the third overlay pattern 34 with respect to the second overlay pattern 24. The second overlay error 31 may be represented as a vector quantity. When the second overlay error 31 is measured, the second overlay pattern 24 may be used as a parent pattern and the third overlay pattern 34 may be used as a child pattern. In other words, the second overlay pattern 24 is a reference pattern.

Figure 12:
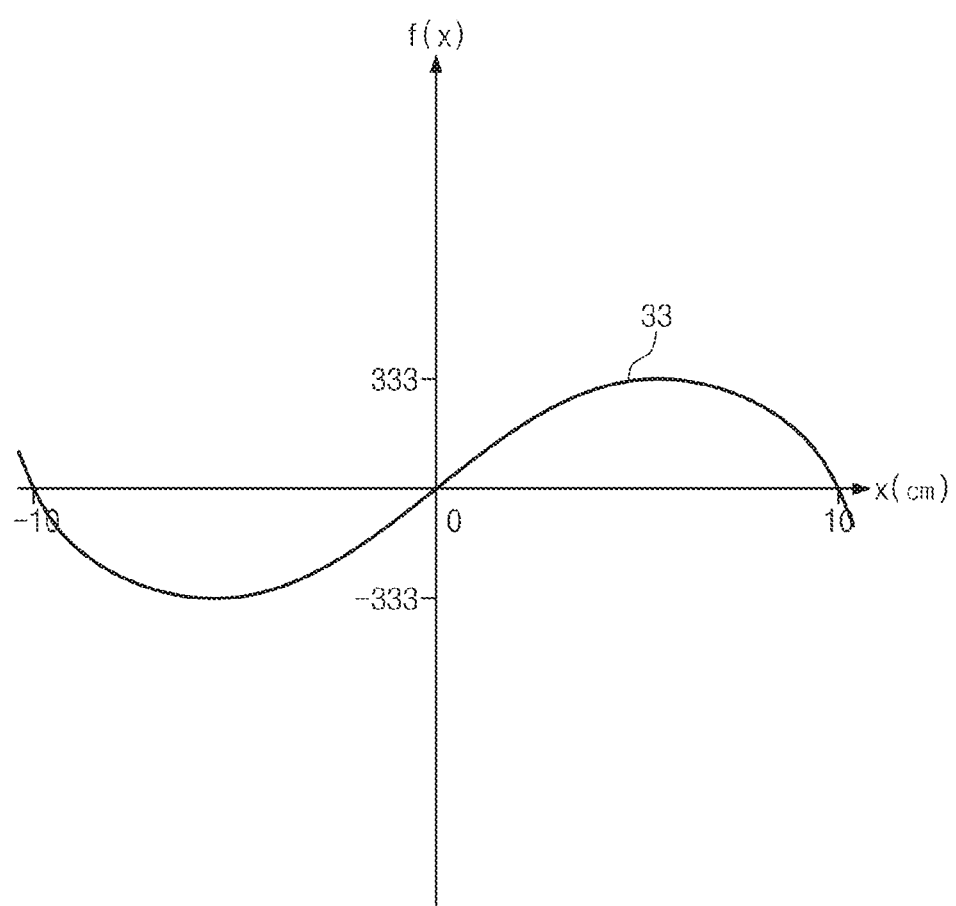
FIG. 12 is a graph illustrating a second overlay error profile obtained from the second overlay error of FIGS. 11A and 11B, according to an exemplary embodiment of the inventive concept.
Figure 13:
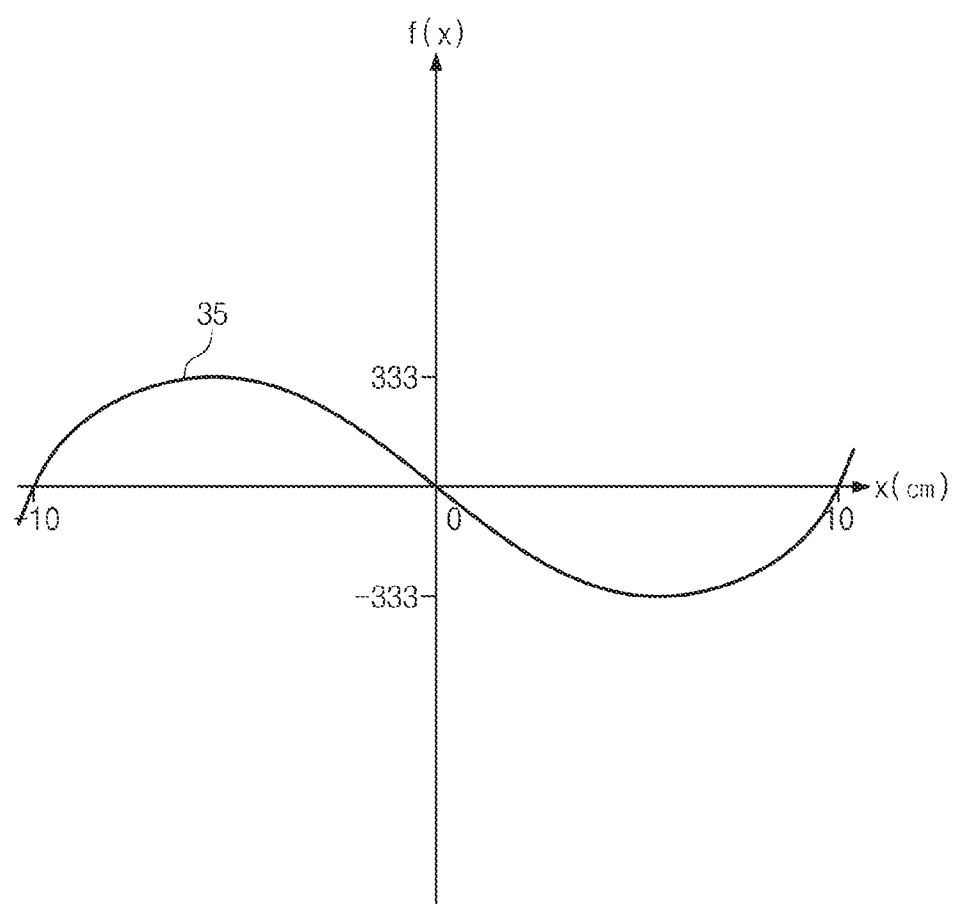
FIG. 13 is a graph illustrating a second overlay correction profile obtained from the second overlay error profile of FIG. 12, according to an exemplary embodiment of the inventive concept.

FIG. 12 illustrates a second overlay error profile 33 obtained from the second overlay error 31, according to an exemplary embodiment of the inventive concept. FIG. 13 is a graph illustrating a second overlay correction profile 35 obtained from the second overlay error profile 33, according to an exemplary embodiment of the inventive concept.

Referring to FIGS. 11B and 12, the inspection system may obtain the second overlay error profile 33 from the measured second overlay error 31. The second overlay error profile 33 may contain information on a calculated position of the third pattern 30 formed on the first substrate W1. The second overlay correction profile 35 may contain information on a position of the third pattern 30, which will be corrected when it is subsequently formed on the second substrate W2. In the case where the second and seventh model parameters $a_2$ and $a_7$ are 50 and $-\frac{1}{2}$, respectively, the second overlay error profile 33 may be expressed by $-\frac{1}{2}x^3+50x$. The second overlay correction profile 35 may have an opposite sign to that of the second overlay error profile 33. In other words, the second overlay correction profile 35 may have an opposite phase to that of the second overlay error profile 33. If the second overlay error profile 33 is given by $-\frac{1}{2}x^3+50x$, the second overlay correction profile 35 may be expressed by $\frac{1}{2}x^3-50x$. Thus, from the time when the second fabrication system 200 is used for the second substrate W2, it is possible to correct an overlay error of the second fabrication system 200.

However, a control parameter of a fabrication system using an overlay correction profile may not be properly corrected. The first to the tenth model parameters $a_1$, $a_2$, $a_3$, $a_4$, $a_5$, $a_6$, $a_7$, $a_8$, $a_9$, and $a_{10}$ of the first overlay correction profile 25 of FIG. 9 may be used to correct a control parameter of the first fabrication system 100. By contrast, at least one of the first to the tenth model parameters $a_1$, $a_2$, $a_3$, $a_4$, $a_5$, $a_6$, $a_7$, $a_8$, $a_9$, and $a_{10}$ of the second overlay correction profile 35 of FIG. 13 may not be used to correct a control parameter of the second fabrication system 200. For example, in the case where, due to the seventh model parameter $a_7$, a position of the third pattern 30 has to be changed by 1 nm in the x direction, a distance between the mirror lenses 230 of FIG. 10 may have to be changed to go beyond a threshold value of about 1 μm or larger. However, the distance between the mirror lenses 230 may not be adjusted to be larger than the threshold value. In such a case, the seventh model parameter $a_7$ may be a non-correctable model parameter. In other words, the seventh model parameter $a_7$ cannot be used to correct a control parameter of the second fabrication system 200. If this is the case, the seventh model parameter $a_7$ in the second fabrication system 200 may be set to one, but the inventive concept is not limited thereto.

Referring to FIGS. 2, 6, and 10, the first fabrication system 100 or the second fabrication system 200 may be used to form an n-th pattern on the (n−1)-th pattern of the first substrate W1 (in S140). Thereafter, the inspection system may be used to measure an (n−1)-th overlay error (in S230).

If a fabrication process on the first substrate W1 is finished, a fabrication process on the second substrate W2 may be successively performed. Referring back to FIGS. 2, 3, and 6, the first fabrication system 100 may be used to form the first pattern 10 on the second substrate W2 (in S110). The first pattern 10 may be formed at a preset position on the second substrate W2. Thereafter, a position of the second pattern 20, which will be formed on the second substrate W2, may be adjusted based on the first overlay correction profile 25.

In the case where, as described above, a position of the third pattern 30 cannot be corrected in the second fabrication system 200, the position of the second pattern 20 may be adjusted in advance by the first fabrication system 100. Therefore, it is possible to correct for such an error in advance. A method of using the first fabrication system 100 to pre-correct and prevent an error in the second fabrication system 200 will be described in more detail below.

Figure 14:
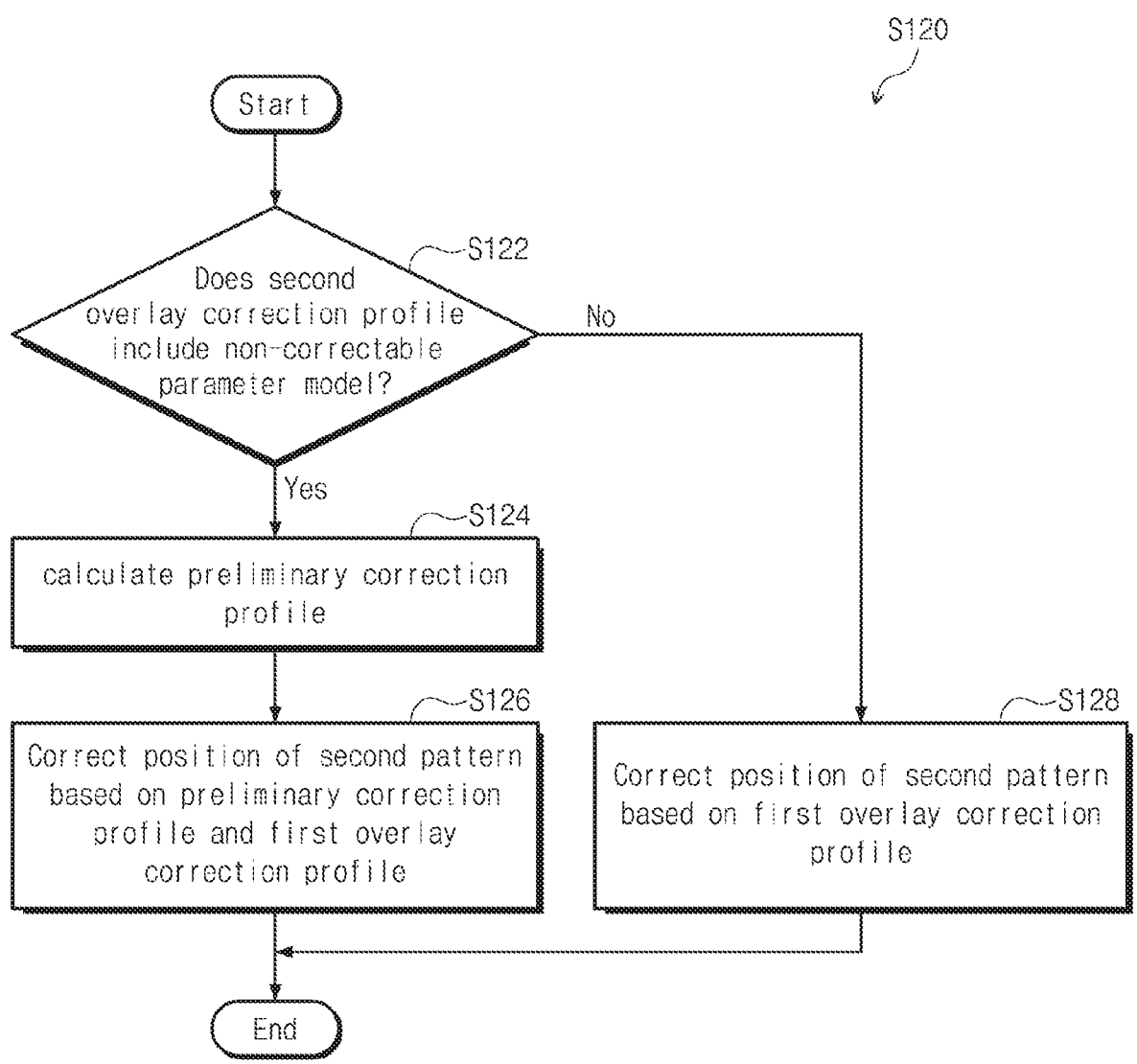
FIG. 14 is a flow chart illustrating a step of forming a second pattern, shown in FIG. 2, according to an exemplary embodiment of the inventive concept.
Figure 15:
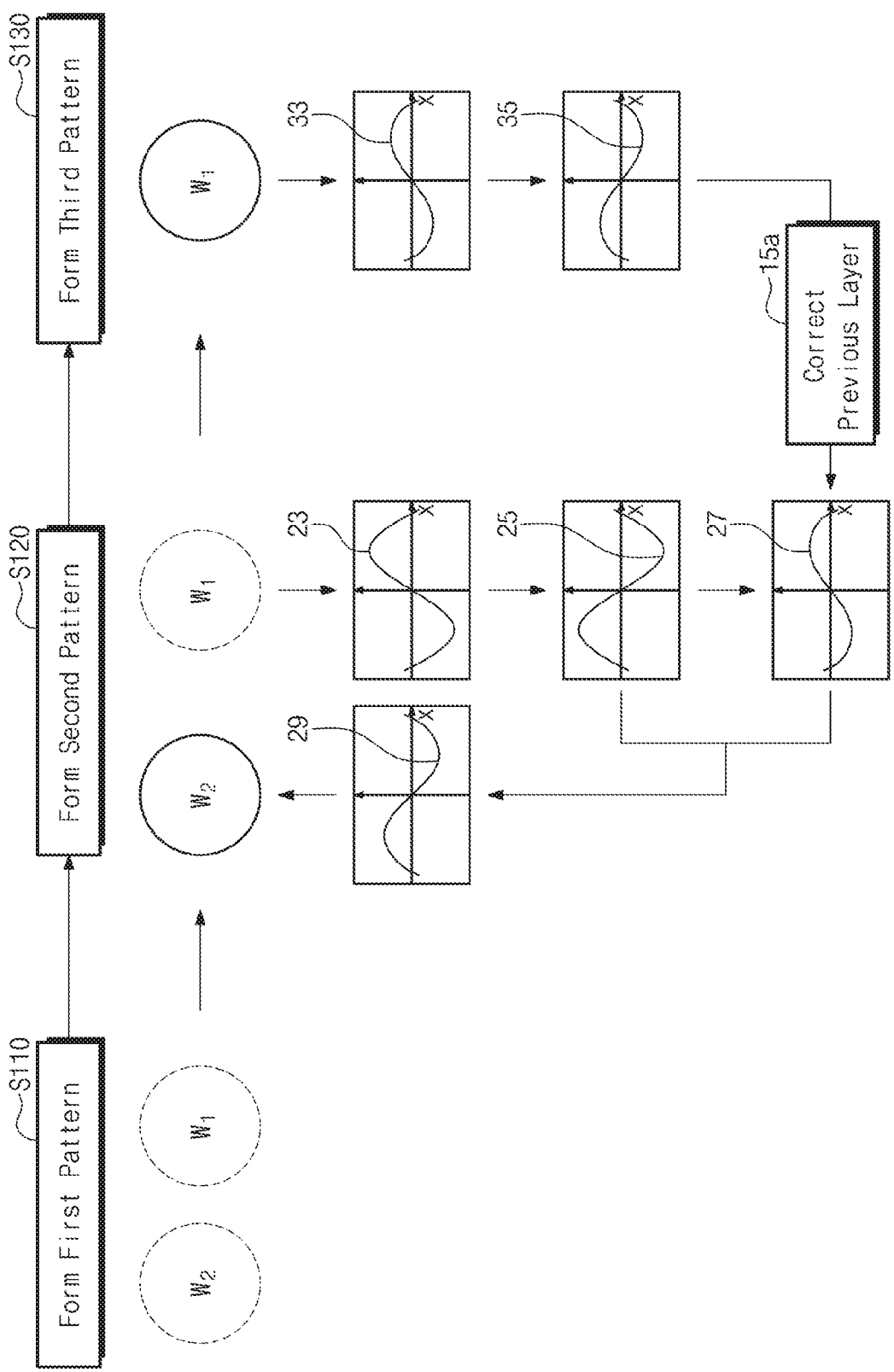
FIG. 15 is a diagram illustrating an example, in which the first fabrication system is used in advance to correct an error, which may occur in the second fabrication system of FIG. 10.
Figure 16:
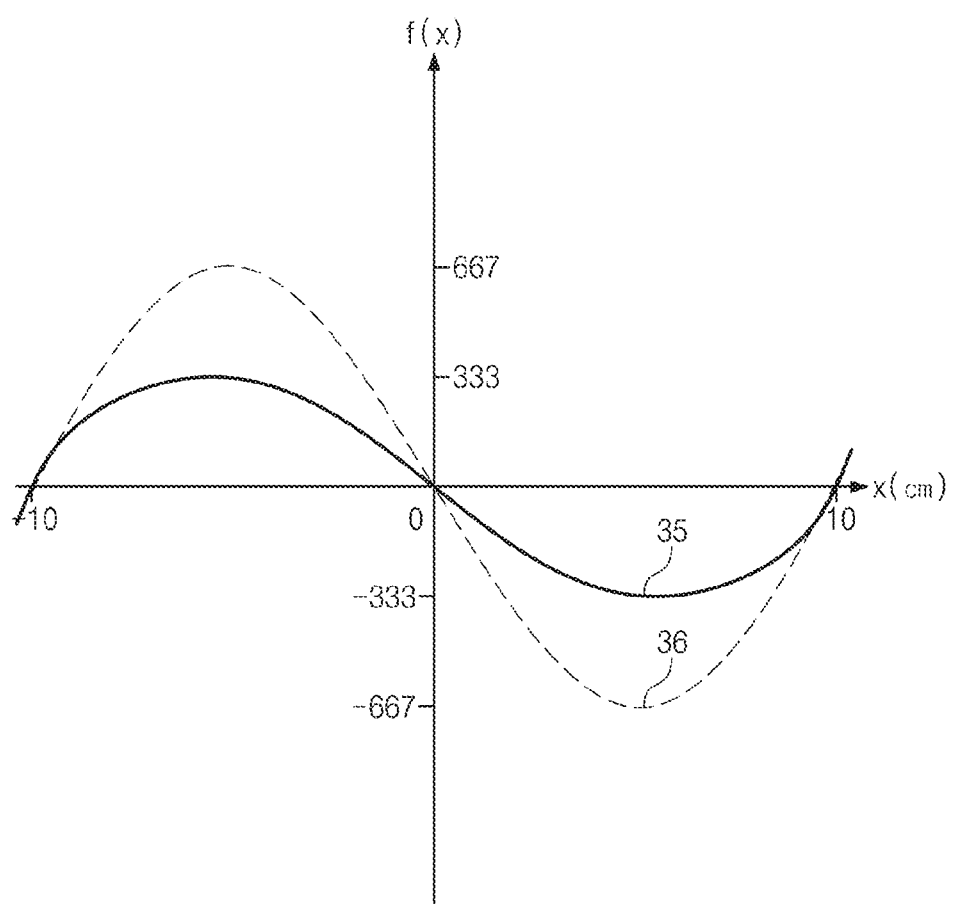
FIG. 16 is a graph illustrating a preset value of a control parameter of the second fabrication system of FIG. 10 and an example of the second overlay correction profile.

FIG. 14 is a flow chart illustrating the step S120 (i.e., forming the second pattern 20) of FIG. 2, according to an exemplary embodiment of the inventive concept. FIG. 15 is a diagram illustrating an example, in which the first fabrication system 100 is used in advance to correct an error, which may occur in the second fabrication system 200. FIG. 16 is a graph illustrating an overlay profile 36, which is preset in a control parameter of the second fabrication system 200, and the second overlay correction profile 35. The overlay profile 36 of FIG. 16 is a curve obtained when a value of 1 is assigned to a seventh model parameter $a_7$ of a polynomial corresponding to a control parameter of the second fabrication system 200. The overlay profile 36 of FIG. 16 may be preset.

Referring to FIG. 14, the formation of the second pattern 20 on the second substrate W2 (in S120) may include determining whether the second overlay correction profile 35 has a non-correctable model parameter that cannot be used to correct the control parameter of the second fabrication system 200 (in S122). If the second overlay correction profile 35 has a non-correctable model parameter, the method of FIG. 14 further includes calculating a preliminary correction profile 27 to cancel the non-correctable model parameter (in S124), and correcting a position of the second pattern 20 based on the preliminary correction profile 27 and the first overlay correction profile 25 (in S126). If the second overlay correction profile 35 does not have a non-correctable model parameter, the method of FIG. 14 further includes correcting a position of the second pattern 20 based on the first overlay correction profile 25 (in S128).

For example, the first fabrication system 100 may be used to determine whether the second overlay correction profile 35 has a non-correctable model parameter that cannot be used to correct the control parameter of the second fabrication system 200 (in S122). In an exemplary embodiment of the inventive concept, in the case where the seventh model parameter $a_7$ of the preset overlay profile 36, which is given in advance as the control parameter of the second fabrication system 200, is different from the seventh model parameter $a_7$ of the second overlay correction profile 35, it may be determined that the second overlay correction profile 35 is non-correctable. For example, as shown in FIG. 16, if the seventh model parameter $a_7$ of the preset overlay profile 36 is 1 and the seventh model parameter $a_7$ of the second overlay correction profile 35 is ½, it may be determined that the seventh model parameter $a_7$ of the second overlay correction profile 35 is the non-correctable model parameter that cannot be used to correct the control parameter of the second fabrication system 200. By contrast, if the seventh model parameter $a_7$ of the second overlay correction profile 35 is coincident with the seventh model parameter $a_7$ of the preset overlay profile 36, it may be determined that the second overlay correction profile 35 does not have the non-correctable model parameter. The seventh model parameter $a_7$ of the second overlay correction profile 35 may be coincident with the seventh model parameter $a_7$ of the preset overlay profile 36 if they have the same value as each other, for example.

Figure 17:
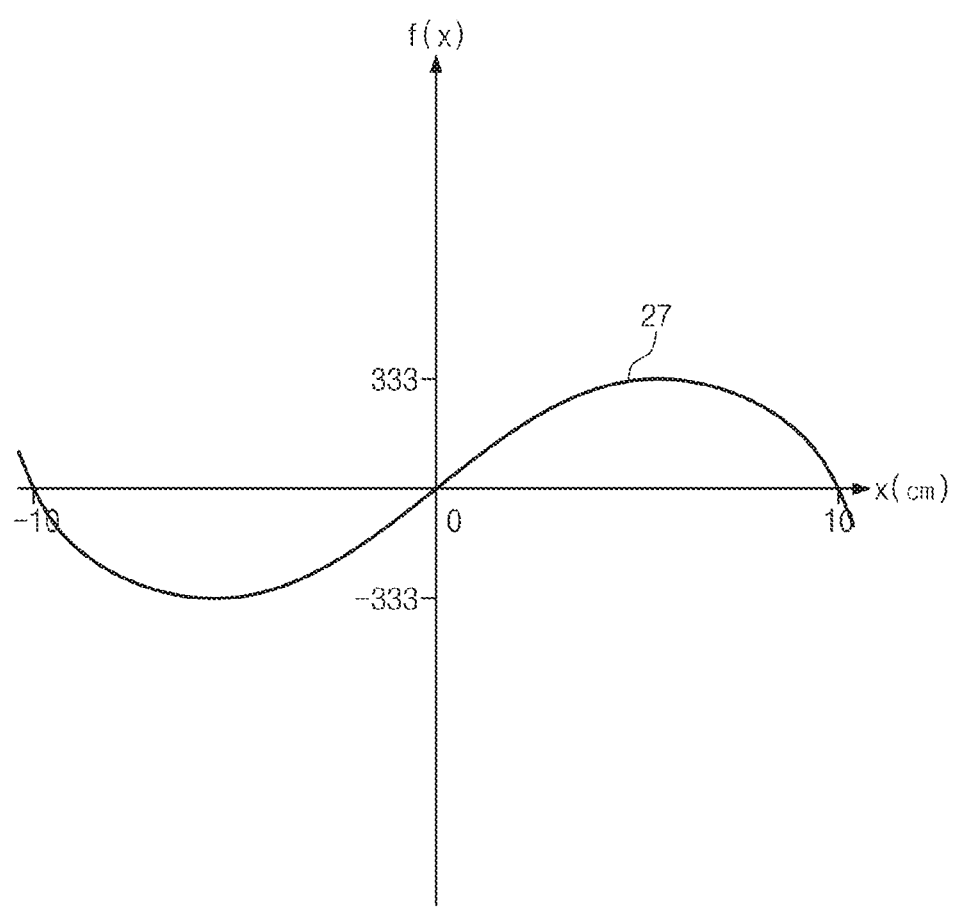
FIG. 17 is a graph illustrating a preliminary correction profile of FIG. 15, according to an exemplary embodiment of the inventive concept.

FIG. 17 is a graph illustrating the preliminary correction profile 27 of FIG. 15, according to an exemplary embodiment of the inventive concept.

Referring to FIGS. 14 and 17, in the case where the second overlay correction profile 35 has the non-correctable model parameter, the first fabrication system 100 may be used to calculate the preliminary correction profile 27 of the second pattern 20 (in S124). In other words, the second pattern 20 may be pre-corrected (see 15a in FIG. 15). For example, the preliminary correction profile 27 may be used to cancel the non-correctable model parameter. The preliminary correction profile 27 may have an opposite sign (or phase) to that of the second overlay correction profile 35. For example, in the case where the second overlay correction profile 35 is given by $\frac{1}{2}x^3 - 50x$, the preliminary correction profile 27 may be given by $-\frac{1}{2}x^3 + 50x$. The preliminary correction profile 27 may be the same as the second overlay error profile 33.

Next, the first fabrication system 100 may correct a position of the second pattern 20 to be formed on the second substrate W2 using the preliminary correction profile 27 and the first overlay correction profile 25 of the first substrate W1 (in S126).

Figure 18:
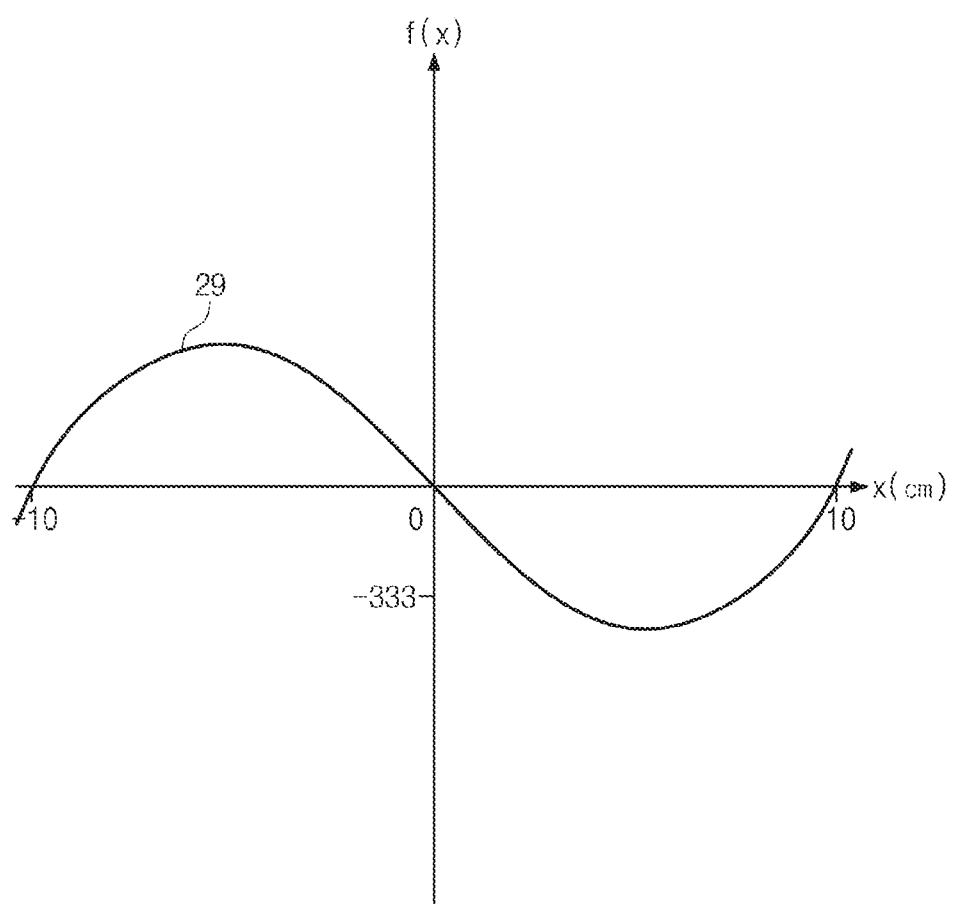
FIG. 18 is a graph illustrating a resultant profile of FIG. 15, according to an exemplary embodiment of the inventive concept.

FIG. 18 is a graph illustrating a resultant profile 29 of FIG. 15, according to an exemplary embodiment of the inventive concept. Referring to FIG. 18, the first fabrication system 100 may be used to add the preliminary correction profile 27 to the first overlay correction profile 25 to thereby obtain a resultant profile 29. The resultant profile 29 may be used to correct a position of the second pattern 20 on the second substrate W2. For example, in the case where the preliminary correction profile 27 is given by $-\frac{1}{2}x^3 + 50x$ and the first overlay correction profile 25 is given by $x^3 - 100x$, a control parameter corresponding to the resultant profile 29 of $\frac{1}{2}x^3 - 50x$, i.e., $(-\frac{1}{2}x^3 + 50x) + (x^3 - 100x)$, may be used to correct a position of the second pattern 20, in the first fabrication system 100.

Figure 19:
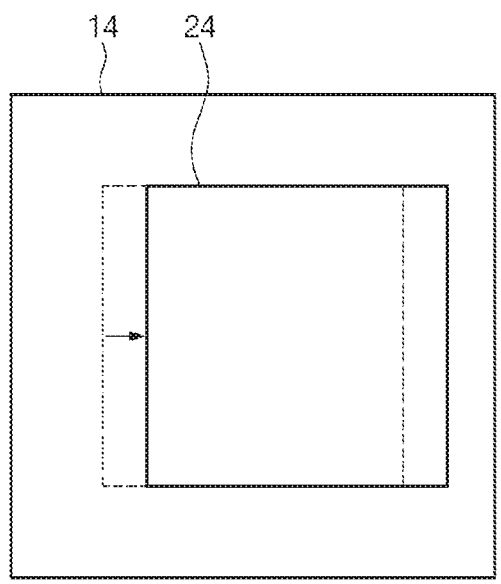
FIG. 19 is a plan view illustrating a second overlay pattern whose position is corrected based on the resultant profile of FIG. 18, according to an exemplary embodiment of the inventive concept.

FIG. 19 is a plan view illustrating the second overlay pattern 24 that is formed at a corrected position of the second substrate W2, based on the resultant profile 29 of FIG. 18, according to an exemplary embodiment of the inventive concept.

Referring to FIG. 19, a position of the second overlay pattern 24 may be corrected in advance in consideration of the position of the third overlay pattern 34, which will be subsequently formed on the second substrate W2. In the case where, as described above, the second fabrication system 200 cannot correct the position of the third overlay pattern 34, the first fabrication system 100 may be used to control the position of the second overlay pattern 24 in advance, based on the position of the third overlay pattern 34.

Referring back to FIG. 14, in the case where the second overlay correction profile 35 does not have a non-correctable model parameter, a control parameter corresponding to the first overlay correction profile 25 of the second substrate W2 may be used to correct a position of the second pattern 20. Therefore, the second pattern 20 may be formed on the second substrate W2 using the first fabrication system 100 (in S128). For example, in the case where the first overlay correction profile 25 of the second substrate W2 is absent, the position of the second pattern 20 may not be corrected and may be fixed as a preset position.

Referring back to FIGS. 2 and 4, the inspection system may be used to measure a first overlay error profile of the second overlay pattern 24 with respect to the first overlay pattern 14 on the second substrate W2 (in S210). In the inspection system, the first overlay correction profile of the second substrate W2 may be calculated from the first overlay error profile. The first overlay error profile of the second substrate W2 may contain information on a calculated position of the second pattern 20 formed on the second substrate W2. The first overlay error profile of the second substrate W2 may be different from the first overlay error profile 23 of the first substrate W1. The first overlay correction profile of the second substrate W2 may contain information on a corrected position of the second pattern 20, which will be subsequently formed on a third substrate W3.

Thereafter, referring to FIGS. 2 and 10, the second fabrication system 200 may be used to correct a position of the third pattern 30 on the second substrate W2 based on the second overlay correction profile 35, and then, to form the third pattern 30 on the second pattern 20 (in S130). Since the non-correctable model parameter is cancelled in advance in the first fabrication system 100, the second overlay correction profile 35 may not have the non-correctable model parameter. For example, the seventh model parameter $a_7$ of the polynomial of the second overlay correction profile 35 may be zero. In the polynomial of the second overlay correction profile 35, the first to sixth and eighth to tenth model parameters $a_1$, $a_2$, $a_3$, $a_4$, $a_5$, $a_6$, $a_8$, $a_9$, and $a_{10}$ may have non-zero values. For example, in the case where the non-correctable model parameter is the entirety of the second overlay correction profile 35, the second overlay correction profile 35 may not be present. In this case, the position of the third pattern 30 may not be corrected, and the third pattern 30 may be formed at a preset position.

If the non-correctable model parameter in the second overlay correction profile 35 is not canceled by the preliminary correction profile 27, the second fabrication system 200 may not be used to correct a position of the third pattern 30, and thus, an overlay correction error may occur. In this case, the second fabrication system 200 cannot be used to form the third pattern 30 on the second substrate W2. By contrast, in the case where, in the first fabrication system 100, a position of the second pattern 20 is adjusted in advance using the preliminary correction profile 27, the third pattern 30 may be properly formed at a preset position on the second pattern 20 using the second fabrication system 200. In other words, an overlay correction error may be prevented.

Referring back to FIGS. 2 and 5, the inspection system may be used to measure a second overlay error profile of the third overlay pattern 34 with respect to the second overlay pattern 24 on the second substrate W2 (in S220). In the inspection system, the second overlay error profile and the second overlay correction profile of the second substrate W2 may be sequentially calculated. The second overlay error profile of the second substrate W2 may contain information on a calculated position of the third pattern 30 formed on the second substrate W2. The second overlay error profile of the second substrate W2 may be different from the second overlay error profile 33 of the first substrate W1. The second overlay correction profile of the second substrate W2 may contain information on a position of the third pattern 30, which will be corrected when it is subsequently formed on a third substrate W3.

Referring to FIGS. 2, 6, and 10, the first fabrication system 100 or the second fabrication system 200 may be used to correct a position of the n-th pattern on the second substrate W2 based on the (n−1)-th overlay correction profile of the first substrate W1, and then, to form an n-th pattern on the (n−1)-th pattern on the second substrate W2 (in S140). Thereafter, the inspection system may be used to measure an (n−1)-th overlay error of the second substrate W2 (in S230). Next, the inspection system may be used to calculate an (n−1)-th overlay error profile and an (n−1)-th overlay correction profile of the second substrate W2 from the (n−1)-th overlay error of the second substrate W2.

If a fabrication process on the second substrate W2 is finished, a fabrication process on the third substrate W3 may be performed. In an exemplary embodiment of the inventive concept, following the second substrate W2, the third substrate W3 may be sequentially provided into the first fabrication system 100, the inspection system, and the second fabrication system 200.

Due to the preliminary correction profile 27, the position of the second overlay pattern 24 may be changed from its original position, as shown in FIG. 19. Thus, the second overlay pattern 24 may not be aligned with the first overlay pattern 14. Accordingly, a position of the first pattern 10, which will be formed on the third substrate W3, may be again corrected based on a position of the second pattern 20 corrected using the preliminary correction profile 27. Hereinafter, a method of correcting the position of the first pattern 10 using the first fabrication system 100 will be described.

Figure 20:
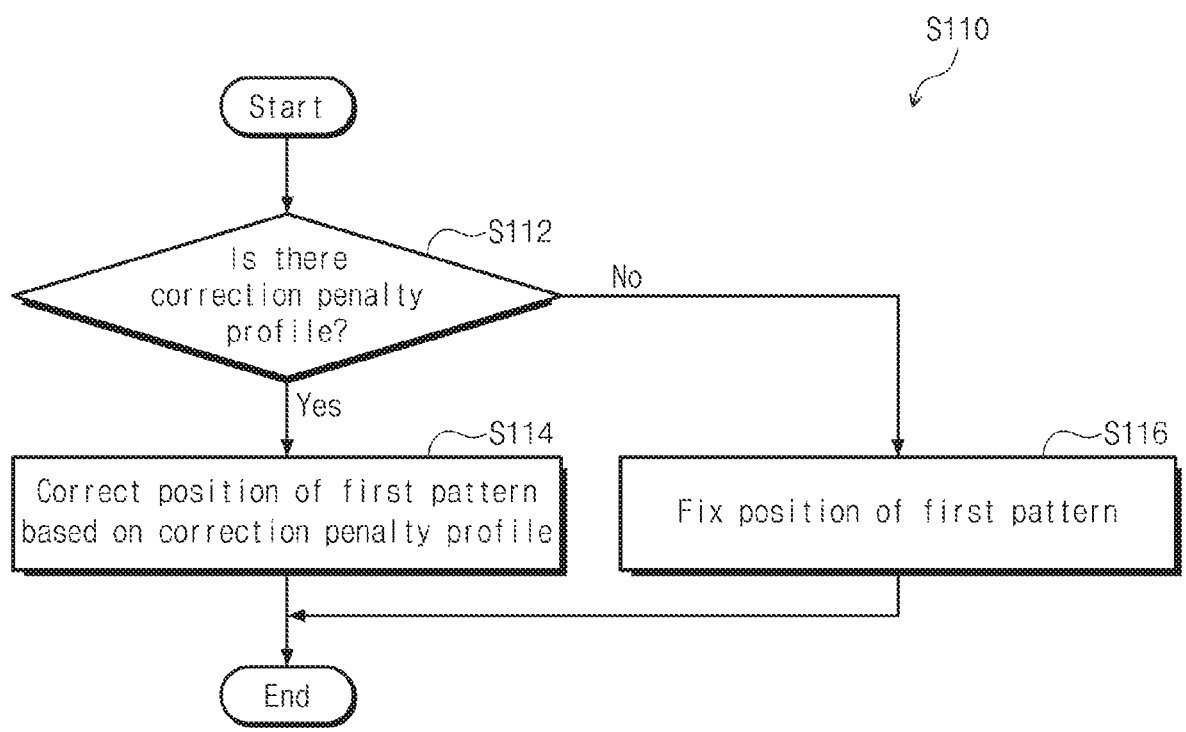
FIG. 20 is a flow chart illustrating a step of forming a first pattern on a third substrate, shown in FIG. 6, according to an exemplary embodiment of the inventive concept.
Figure 21:
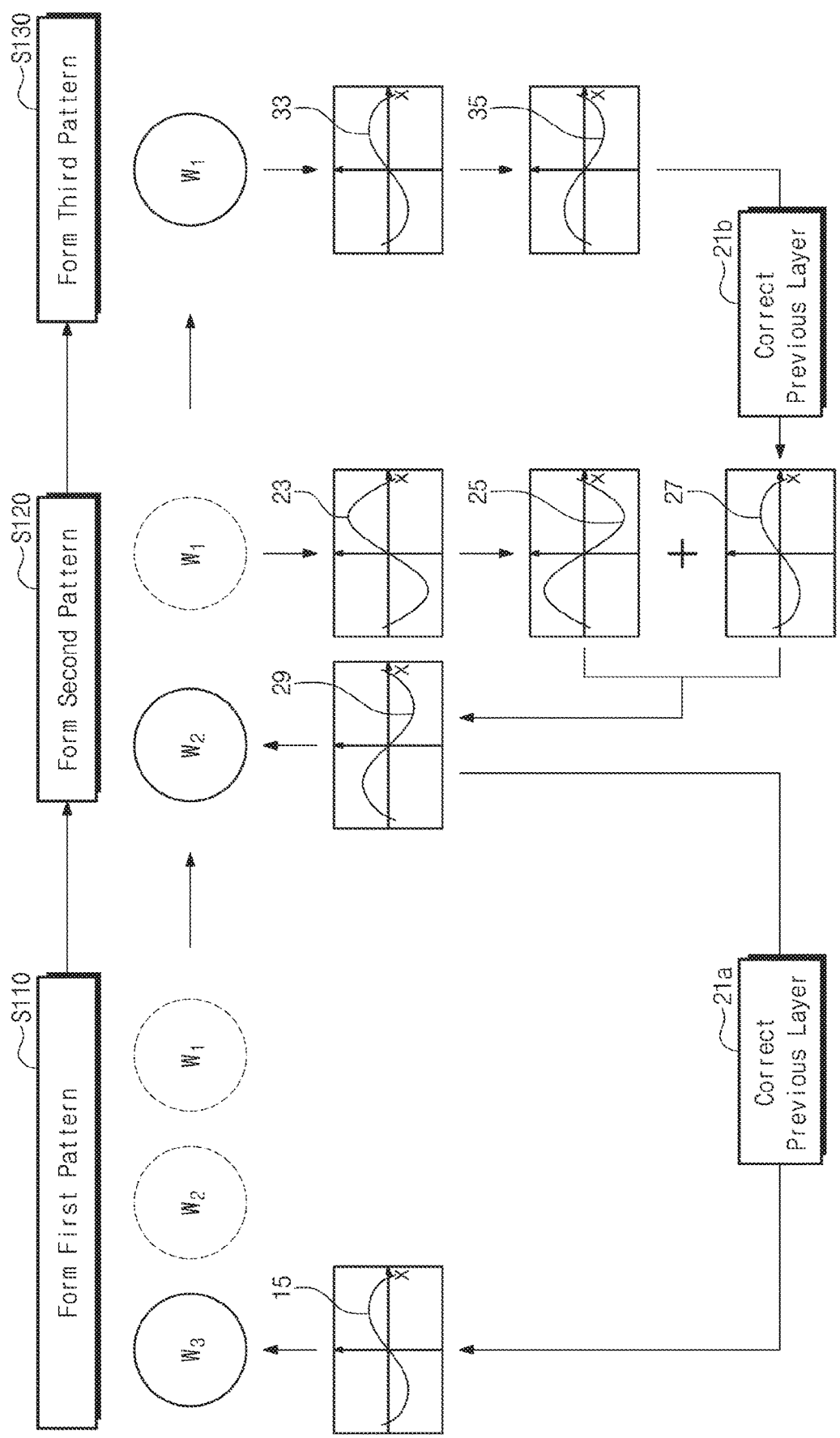
FIG. 21 is a diagram illustrating a method of correcting a position of a first pattern using the first fabrication system of FIG. 6, according to an exemplary embodiment of the inventive concept.
Figure 22:
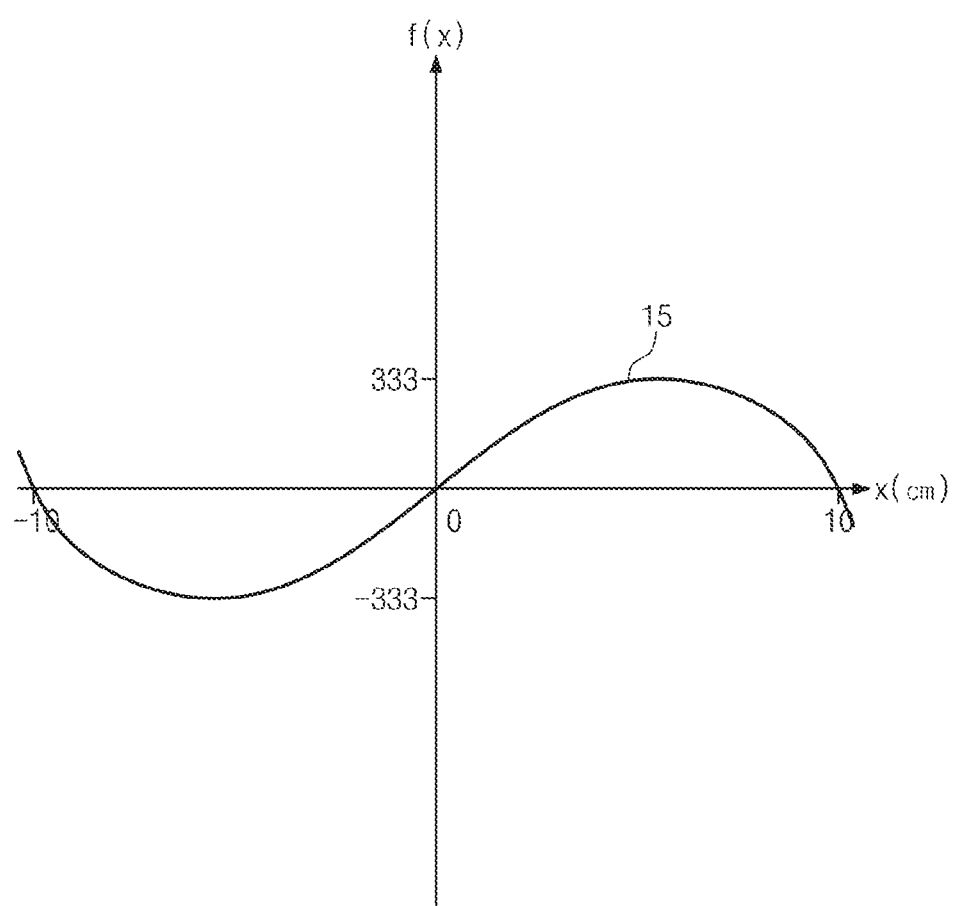
FIG. 22 is a graph illustrating a correction penalty profile of FIG. 20, according to an exemplary embodiment of the inventive concept.

FIG. 20 is a flow chart illustrating a step of forming the first pattern 10 on the third substrate W3, according to an exemplary embodiment of the inventive concept. FIG. 21 is a diagram illustrating a method of correcting a position of the first pattern 10 using the first fabrication system 100, according to an exemplary embodiment of the inventive concept. FIG. 22 is a graph illustrating a correction penalty profile 15 of FIG. 20, according to an exemplary embodiment of the inventive concept.

Referring to FIG. 20, the formation of the first pattern 10 on the third substrate W3 (in S110) may include determining whether there is a correction penalty profile 15 (in S112), correcting a position of the first pattern 10 based on the correction penalty profile 15 (in S114), and fixing the position of the first pattern 10 (in S116).

For example, referring to FIGS. 20 to 22, the first fabrication system 100 may be used to determine whether there is the correction penalty profile 15 of the first pattern 10 (in S112). The correction penalty profile 15 may be produced as a result of correcting a position of the second pattern 20 to be formed on the first pattern 10 of the third substrate W3 (see 21a and 21b in FIG. 21). The correction penalty profile 15 may be a position correction profile of the first pattern 10. The correction penalty profile 15 may be substantially the same as the preliminary correction profile 27. For example, in the case where the preliminary correction profile 27 is given by $-\frac{1}{2}x^3+50x$, the correction penalty profile 15 may also be given by $-\frac{1}{2}x^3+50x$.

Likewise, in the case where there is the correction penalty profile 15, the position of the first pattern 10 may be corrected using the correction penalty profile 15, and the first pattern 10 may be formed on the third substrate W3 using the first fabrication system 100 (in S114).

Figure 23:
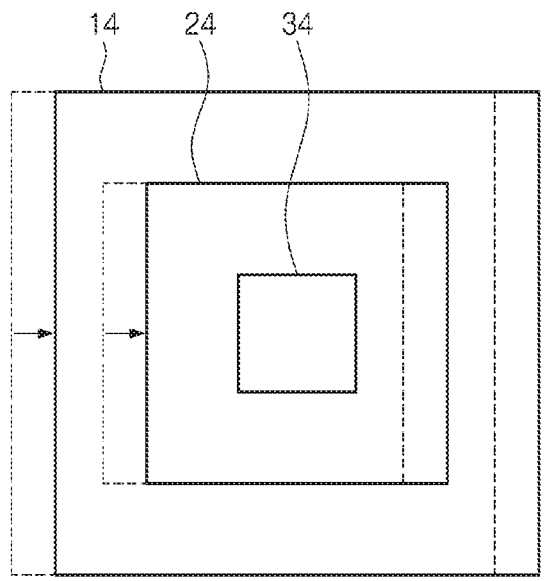
FIG. 23 is a plan view illustrating a first overlay pattern whose position is corrected based on the correction penalty profile of FIG. 22, according to an exemplary embodiment of the inventive concept.

FIG. 23 is a plan view illustrating the first overlay pattern 14 whose position is corrected based on the correction penalty profile 15 of FIG. 22, according to an exemplary embodiment of the inventive concept.

Referring to FIG. 23, a position of the first overlay pattern 14 may be determined by a position of the second overlay pattern 24. In the case where the position of the second overlay pattern 24 on the second substrate W2 is corrected based on the preliminary correction profile 27, the position of the first overlay pattern 14 to be formed on the third substrate W3 may be corrected using the correction penalty profile 15.

Referring back to FIG. 20, if there is no correction penalty profile 15, a position of the first pattern 10 may be fixed to a preset position, and the first pattern 10 may be formed on the third substrate W3 using the first fabrication system 100 (in S116). The position of the first pattern 10 may be fixed to the preset position, and the first pattern 10 may be formed on the third substrate W3.

Referring to FIGS. 2, 6, and 14, the second pattern 20 may be formed on the first pattern 10 of the third substrate W3 using the first fabrication system 100 (in S120). In the first fabrication system 100, the preliminary correction profile 27 and the first overlay error profile of the third substrate W3 may be used to correct a position of the second pattern 20. For example, the preliminary correction profile 27 may be added to the first overlay correction profile of the third substrate W3.

Thereafter, the inspection system may be used to measure the first overlay error profile of the third substrate W3 (in S210). In the inspection system, the first overlay correction profile of the third substrate W3 may be calculated from the first overlay error profile of the third substrate W3. The first overlay error profile of the third substrate W3 may contain information on a calculated position of the second pattern 20 formed on the third substrate W3, and the first overlay correction profile of the third substrate W3 may contain information on a position of the second pattern 20, which will be corrected when it is formed on an n-th substrate to be provided after the third substrate W3.

Referring to FIGS. 2 and 10, the second fabrication system 200 may be used to form the third pattern 30 on the second pattern 20 of the third substrate W3 (in S130). In the second fabrication system 200, the second overlay correction profile of the third substrate W3 may be used to correct a position of the third pattern 30 on the third substrate W3. For example, in the case where the second overlay correction profile of the third substrate W3 is absent, the third pattern 30 may be formed on the third substrate W3 without any position correction.

Next, the inspection system may be used to measure the second overlay error profile of the third substrate W3 (in S220). Thereafter, in the inspection system, the second overlay correction profile of the third substrate W3 may be calculated from the second overlay error profile of the third substrate W3. The second overlay error profile of the third substrate W3 may contain information on a calculated position of the third pattern 30 formed on the third substrate W3, and the second overlay correction profile of the third substrate W3 may contain information on a position of the third pattern 30, which will be corrected when it is formed on an n-th substrate to be provided after the third substrate W3.

The first fabrication system 100 or the second fabrication system 200 may be used to form an n-th pattern on the third substrate W3 (in S140).

The inspection system may be used to measure an (n−1)-th overlay error profile of the third substrate W3 (in S230). The inspection system may also be used to calculate an (n−1)-th overlay error profile and an (n−1)-th overlay correction profile of the third substrate W3. The (n−1)-th overlay error profile of the third substrate W3 may contain information on a calculated position of the n-th pattern formed on the third substrate W3, and the (n−1)-th overlay correction profile of the third substrate W3 may contain information on a position of the n-th pattern, which will be corrected when it is formed on an n-th substrate to be provided after the third substrate W3.

Figure 24:
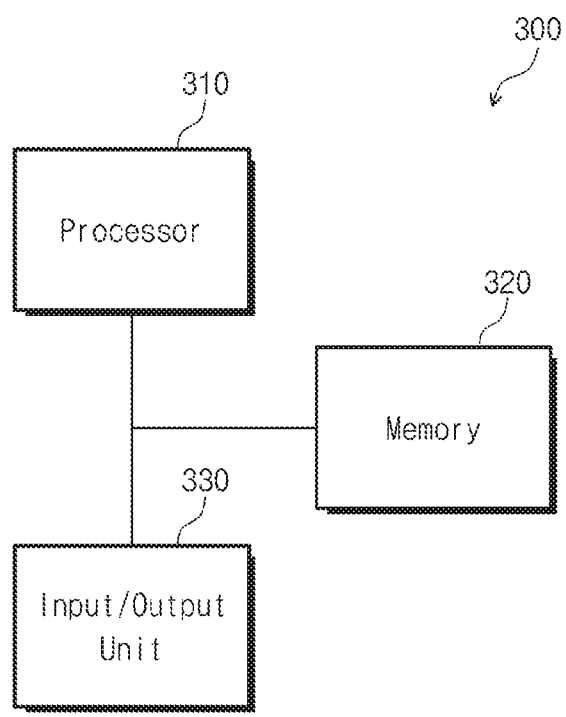
FIG. 24 is a block diagram illustrating a control system that can be used to control the first and second fabrication systems of FIG. 6, according to an exemplary embodiment of the inventive concept.

FIG. 24 is a block diagram illustrating a control system 300 that can be used to control the first and second fabrication systems 100 and 200, according to an exemplary embodiment of the inventive concept.

Referring to FIG. 24, the control system 300 may include a processor 310, a memory 320, and an input/output unit 330. The processor 310 may be used to execute a program code, and according to the program code, a preliminary correction profile 27 and a correction penalty profile 15 may be obtained for each of substrates and/or each of lots. For example, the processor 310 may be configured to execute the steps illustrated in FIGS. 1, 2, 14, and 20. For example, the program code to be executed by the processor 310 may be configured to perform steps including a) receiving the second overlay error 31 of the second and third patterns 20 and 30 on the first substrate W1, b) obtaining the second overlay correction profile 35, in which a model parameter of the second overlay error 31 is contained, through modeling on the second overlay error 31, c) determining whether the second overlay correction profile 35 has a non-correctable model parameter that cannot be used to correct a control parameter of the second fabrication system 200, d) obtaining a preliminary correction profile 27, which can be used to cancel the non-correctable model parameter, when the second overlay correction profile 35 has the non-correctable model parameter, and e) correcting a position of the second pattern 20, which will be formed on the second substrate W2, based on the preliminary correction profile 27, in the first fabrication system 100.

The memory 320 may be connected to the processor 310. The memory 320 may be used to store the program code. In an exemplary embodiment of the inventive concept, the memory 320 may also be used to store the preliminary correction profile 27 and the correction penalty profile 15 of intrinsic information (e.g., logistical information) for each of substrates and/or each of lots.

The input/output unit 330 may be used to connect the processor 310 to the first fabrication system 100 and/or the second fabrication system 200. The processor 310 may output a control signal to the outside and receive an input signal from the outside through the input/output unit 330.

In an overlay-correcting method according to an exemplary embodiment of the inventive concept, a preliminary correction profile is used to correct a model parameter, which cannot be corrected in a subsequent fabrication step, in advance in a previous fabrication step. Accordingly, it is possible to prevent an overlay correction error from occurring in a fabrication system that will be used in the subsequent fabrication step.

While the inventive concept has been described with reference to exemplary embodiments thereof, it will be understood by one of ordinary skill in the art that variations in form and detail may be made thereto without departing from the spirit and scope of the inventive concept. Therefore, it should be understood that the above embodiments are not limiting, but illustrative.

What is claimed is:
1. A method of correcting an overlay, comprising:
forming a first pattern on a first substrate using a first fabrication system;
forming a second pattern on the first pattern using the first fabrication system;
obtaining a first overlay error profile of the second pattern with respect to the first pattern and obtaining a first overlay correction profile from the first overlay error profile;
forming a third pattern on the second pattern using a second fabrication system;
obtaining a second overlay error profile of the third pattern with respect to the second pattern and obtaining a second overlay correction profile from the second overlay error profile; and
forming the second pattern on a second substrate using the first fabrication system,
wherein the forming of the second pattern on the second substrate comprises:

determining whether the second overlay correction profile has a non-correctable model parameter that cannot be used to correct a control parameter of the second fabrication system; and when the second overlay correction profile has the non-correctable model parameter, obtaining a preliminary correction profile for the first fabrication system to correct a position of the second pattern before the second pattern is formed on the second substrate.

2. The method of claim 1, further comprising correcting the position of the second pattern on the second substrate with the first fabrication system, using a resultant profile which is obtained by adding the preliminary correction profile to the first overlay correction profile.

3. The method of claim 1, wherein the first overlay correction profile has an opposite sign to that of the first overlay error profile, wherein the sign includes a positive mathematical sign or a negative mathematical sign, and
the preliminary correction profile is the same as the first overlay error profile.

4. The method of claim 1, further comprising forming the first pattern on a third substrate, using the first fabrication system,
wherein the forming of the first pattern on the third substrate comprises correcting a position of the first pattern before the first pattern is formed on the third substrate, using a correction penalty profile, when the position of the second pattern is corrected on the second substrate, and
the correction penalty profile is the same as the preliminary correction profile.

5. The method of claim 1, wherein the forming of the second pattern on the second substrate further comprises correcting the position of the second pattern before the second pattern is formed on the second substrate using the first overlay correction profile, when the second overlay correction profile does not have the non-correctable model parameter.

6. The method of claim 1, wherein the first fabrication system comprises an argon fluoride (ArF) immersion exposure system, and
the second fabrication system comprises an extreme ultraviolet lithography (EUV) exposure system.

7. The method of claim 6, wherein each of the first and second overlay correction profiles is given as follows:
$a_1+a_2x+a_3y+a_4x^2+a_5xy+a_6y^2+a_7x^3+a_8x^2y+a_9xy^2+a_{10}y^3$,
where $a_1$, $a_2$, $a_3$, $a_4$, $a_5$, $a_6$, $a_7$, $a_8$, $a_9$, and $a_{10}$ are first, second, third, fourth, fifth, sixth, seventh, eighth, ninth and tenth model parameters, respectively,
x and y are position coordinates, and
the non-correctable model parameter is the control parameter of the EUV exposure system.

8. The method of claim 7, further comprising correcting a position of the third pattern before the third pattern is formed on the second substrate, using the second overlay correction profile,
wherein the seventh model parameter is cancelled by the preliminary correction profile.

9. The method of claim 7, wherein the seventh model parameter is fixed in the EUV exposure system.

10. The method of claim 1, wherein the first and the second overlay error profiles are obtained from first and second overlay errors, respectively,
the first overlay error is a displacement of the second pattern with respect to the first pattern, and
the second overlay error is a displacement of the third pattern with respect to the second pattern.

11. A method of correcting an overlay, comprising:
forming a first pattern on a first substrate using a first fabrication system;
forming a second pattern on the first pattern using a second fabrication system;
obtaining an overlay error profile of the second pattern with respect to the first pattern and obtaining an overlay correction profile from the overlay error profile; and
forming the first pattern on a second substrate using the first fabrication system,
wherein the forming of the first pattern on the second substrate comprises:
determining whether the overlay correction profile has a non-correctable model parameter that cannot be used to correct a control parameter of the second fabrication system; and
when the overlay correction profile has the non-correctable model parameter, obtaining a preliminary correction profile for the first fabrication system to correct a position of the first pattern before the first pattern is formed on the second substrate.

12. The method of claim 11, further comprising correcting the position of the first pattern on the second substrate using the overlay correction profile,
wherein the non-correctable model parameter is cancelled by the preliminary correction profile.

13. The method of claim 11, wherein the preliminary correction profile has an opposite mathematical sign to that of the non-correctable model parameter.

14. The method of claim 11, wherein the preliminary correction profile is the same as the overlay error profile.

15. The method of claim 11, wherein the first fabrication system comprises an argon fluoride (ArF) immersion exposure system, and
the second fabrication system comprises an extreme ultraviolet lithography (EUV) exposure system.

16. A control system, comprising:
a processor; and
a memory configured to store a program code to be executed by the processor,
wherein the program code is configured to perform steps of:
obtaining an overlay error profile from an overlay error of first and second patterns on a first substrate;
obtaining an overlay correction profile, in which a model parameter of the overlay error profile is included, by using the overlay error;
determining whether the overlay correction profile has a non-correctable model parameter that cannot be used to correct a control parameter of a first fabrication system for a subsequent step; and
when the overlay correction profile has the non-correctable model parameter, obtaining a preliminary correction profile, which can be used to cancel the non-correctable model parameter to correct a position of the first pattern on a second substrate, in a second fabrication system for a previous step.

17. The control system of claim 16, wherein the preliminary correction profile is the same as the overlay error profile.

18. The control system of claim 16, wherein the first fabrication system comprises an extreme ultraviolet lithography (EUV) exposure system, and
the second fabrication system comprises an argon fluoride (ArF) immersion exposure system.

19. The control system of claim 18, wherein the overlay correction profile is given as follows:

$a_1+a_2x+a_3y+a_4x^2+a_5xy+a_6y^2+a_7x^3+a_8x^2y+a_9xy^2+a_{10}y^3$, where $a_1$, $a_2$, $a_3$, $a_4$, $a_5$, $a_6$, $a_7$, $a_8$, $a_9$, and $a_{10}$ are first, second, third, fourth, fifth, sixth, seventh, eighth, ninth and tenth model parameters, x and y are position coordinates, and the non-correctable model parameter is the control parameter of the EUV exposure system.

20. The control system of claim 19, wherein the processor is used to correct a position of the second pattern on the second substrate using the overlay correction profile, and the seventh model parameter is cancelled by the preliminary correction profile.

* * * * *